United States Patent
Lee et al.

(10) Patent No.: US 12,016,214 B2
(45) Date of Patent: Jun. 18, 2024

(54) DISPLAY PANEL WITH CONDUCTIVE PORTION OVERLAPPING POWER PADS

(71) Applicant: Samsung Display Co., Ltd., Yongin-Si (KR)

(72) Inventors: Chung-Seok Lee, Hwaseong-si (KR); Hayoung Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 130 days.

(21) Appl. No.: 16/895,325

(22) Filed: Jun. 8, 2020

(65) Prior Publication Data

US 2021/0043711 A1 Feb. 11, 2021

(30) Foreign Application Priority Data

Aug. 9, 2019 (KR) .......................... 10-2019-0097665

(51) Int. Cl.
*H10K 59/131* (2023.01)
(52) U.S. Cl.
CPC ................................. *H10K 59/131* (2023.02)
(58) Field of Classification Search
CPC ............ H01L 27/3276; H01L 27/1244; H01L 51/5203; G02F 1/13458; G02F 1/136254; G09F 9/33; H10K 59/131; H10K 50/805
USPC ......................................................... 257/88
See application file for complete search history.

(56) References Cited

U.S. PATENT DOCUMENTS

| | | | |
|---|---|---|---|
| 6,621,207 B2 | 9/2003 | Uda et al. | |
| 7,839,479 B2 | 11/2010 | Choi | |
| 8,057,691 B2 | 11/2011 | Yoo et al. | |
| 9,431,471 B2 | 8/2016 | Bae et al. | |
| 9,436,041 B2 | 9/2016 | Kim et al. | |
| 10,121,843 B2 | 11/2018 | Tsai et al. | |
| 2008/0088760 A1 | 4/2008 | Kawano et al. | |
| 2011/0139493 A1* | 6/2011 | Sumida | H05K 3/361 174/254 |
| 2014/0170387 A1* | 6/2014 | Kashima | C03C 21/00 428/157 |
| 2015/0048329 A1* | 2/2015 | Kim | H01L 51/524 257/40 |
| 2017/0219922 A1 | 8/2017 | Ku et al. | |
| 2018/0226611 A1* | 8/2018 | Andou | H01L 51/0097 |
| 2018/0247993 A1* | 8/2018 | Fujioka | H01L 27/3276 |

(Continued)

FOREIGN PATENT DOCUMENTS

| | | | |
|---|---|---|---|
| CN | 107799538 A * | 3/2018 | ......... H01L 27/1244 |
| EP | 1215701 | 6/2002 | |
| EP | 1610389 | 12/2005 | |

(Continued)

OTHER PUBLICATIONS

Extended European Search Report—European Patent Application 20189772.5 dated Dec. 2, 2020, citing references listed within.

*Primary Examiner* — Nduka E Ojeh
*Assistant Examiner* — Laura M Dykes
(74) *Attorney, Agent, or Firm* — CANTOR COLBURN LLP

(57) ABSTRACT

A display panel includes a base substrate, pixels, signal lines, a power line, signal pads, power pads, and a conductive portion electrically connected to the power pads and extending from an area overlapping the power pads to an edge of the base substrate. An opening is defined in conductive portion by a removed portion thereof.

22 Claims, 14 Drawing Sheets

(56) References Cited

U.S. PATENT DOCUMENTS

2021/0313412 A1\* 10/2021 Okabe .................... H05B 33/02
2022/0140056 A1\* 5/2022 Yamanaka .............. G06F 1/189
                                                                                                                             257/40

FOREIGN PATENT DOCUMENTS

| JP | S60146225 | 8/1985 |
| KR | 1020150037198 A | 4/2015 |
| KR | 1020160082883 A | 7/2016 |

\* cited by examiner

DISPLAY PANEL WITH CONDUCTIVE PORTION OVERLAPPING POWER PADS

This application claims priority to Korean Patent Application No. 10-2019-0097665, filed on Aug. 9, 2019, and all the benefits accruing therefrom under 35 U.S.C. § 119, the content of which in its entirety is herein incorporated by reference.

BACKGROUND

1. Field

The disclosure relates to a display panel with improved product reliability and a display device including the display panel.

2. Description of the Related Art

In general, an electronic device, such as a mobile phone, a laptop computer, and a television, includes two or more electronic components, e.g., an electric optical panel, a main wiring board, and a flexible wiring board. The two or more electronic components are electrically connected to each other via a connection between pads. Pad portions of the two or more electronic components are coupled to each other by an alignment process and are coupled to each other using a thermal compression tool.

SUMMARY

The disclosure provides a display panel with improved product reliability.

The disclosure provides a display device including the display panel.

An embodiment of the invention provides a display panel including a base substrate in which a first area, a second area, and a third area are sequentially defined in a first direction, pixels disposed on the first area, signal lines disposed on the base substrate and electrically connected to the pixels, a power line disposed on the base substrate, where the power line supplies a power to the pixels, signal pads disposed on the second area, arranged in a second direction crossing the first direction, and electrically connected to the signal lines, power pads disposed on the second area, arranged in the second direction, and electrically connected to the power line, and a conductive portion disposed on the second area and the third area, electrically connected to the power pads, and extending from an area overlapping the power pads to an edge of the base substrate. In such an embodiment, an opening is defined in the conductive portion by a removed portion thereof.

In an embodiment, the conductive portion may include a first sub-conductive portion disposed on the second area and disposed between the power pads and the base substrate and a second sub-conductive portion disposed on the third area and electrically connected to the first sub-conductive portion and the power pads, and the opening may be defined in the second sub-conductive portion.

In an embodiment, the second sub-conductive portion may include conductive bars arranged in the second direction, and the conductive bars may be spaced apart from each other in the second direction.

In an embodiment, each of the conductive bars may have a width greater than a width of each of the power pads.

In an embodiment, a number of the conductive bars may be less than a number of the power pads.

In an embodiment, the second sub-conductive portion may include a conductive body extending in the second direction and conductive protrusions protruding from the conductive body to the edge of the base substrate, and a width in the second direction of each of the conductive protrusions may be less than a width in the second direction of the conductive body.

In an embodiment, the conductive protrusions may be spaced apart from each other in the second direction.

In an embodiment, the second sub-conductive portion may include first conductive bars arranged in the first direction and second conductive bars arranged in the first direction, and the first conductive bars may be disposed in a layer different from a layer in which the second conductive bars are disposed.

In an embodiment, the first conductive bars may be alternately arranged with the second conductive bars in the first direction in a plan view.

In an embodiment, each of the first conductive bars and the second conductive bars may extend in the second direction.

In an embodiment, the first conductive bars may be electrically connected to the second conductive bars.

In an embodiment, the display panel may further include an organic layer disposed to cover the conductive portion, and the organic layer may extend in the second direction.

In an embodiment, the power line may have a width greater than a width of each of the power pads.

In an embodiment, the base substrate may include an upper surface, a first slant surface extending from the upper surface, a side surface extending from the first slant surface, a second slant surface extending from the side surface, and a bottom surface extending from the second slant surface, and the first area, the second area and the third area may be defined in the upper surface.

In an embodiment, the opening may be provided in a groove form defined by the removing portion of the conductive portion in a thickness direction of the conductive portion.

In an embodiment, the display panel may further include an additional metal bar disposed on the conductive portion, and the additional metal bar may extend in the second direction.

An embodiments of the invention provides a display device including a display panel including a base substrate in which a first area, a second area, and a third area are sequentially defined in a first direction, pixels disposed on the first area, signal lines disposed on the first area, a power line disposed on the first area, signal pads electrically connected to the signal lines and disposed on the second area, power pads electrically connected to the power line and disposed on the second area, and a conductive portion disposed on the third area and electrically connected to the power pads, and a circuit board disposed on the display panel and electrically connected to the power pads and the signal pads. In such an embodiment, an opening is defined in a portion of the conductive portion overlapping the third area.

In an embodiment, the display panel may further include an organic layer disposed on the third area to cover the conductive portion.

In an embodiment, the opening extends in the first direction, the conductive portion may include conductive bars spaced apart from each other with the opening interposed therebetween, each of the conductive bars may have a width equal to or greater than a width of each of the power pads, and a number of the conductive bars may be equal to or less than a number of the power pads.

In an embodiment, the conductive portion may include a conductive body extending in a second direction crossing the first direction and conductive protrusions protruding from the conductive body to an edge of the base substrate, and a width in the second direction of each of the conductive protrusions may be less than a width in the second direction of the conductive body.

In an embodiment, the conductive portion may include first conductive bars arranged in the first direction and second conductive bars arranged in the first direction, and the first conductive bars may be disposed in a layer different from a layer in which the second conductive bars are disposed.

In an embodiment, each of the first conductive bars and the second conductive bars may extend in a second direction crossing the first direction, the first conductive bars may be alternately arranged with the second conductive bars in a plan view, and the first conductive bars may be electrically connected to the second conductive bars.

According to embodiments, even when the peeling phenomenon occurs in the portion of the conductive portion adjacent to the edge of the base substrate, the peeling phenomenon may be effectively prevented from proceeding in the first direction, the second direction, or both the first and second directions. Thus, the reliability of the display device may be improved.

BRIEF DESCRIPTION OF THE DRAWINGS

The above and other features of the disclosure will become readily apparent by reference to the following detailed description of exemplary embodiments when considered in conjunction with the accompanying drawings, in which.

DETAILED DESCRIPTION

Figure 1:
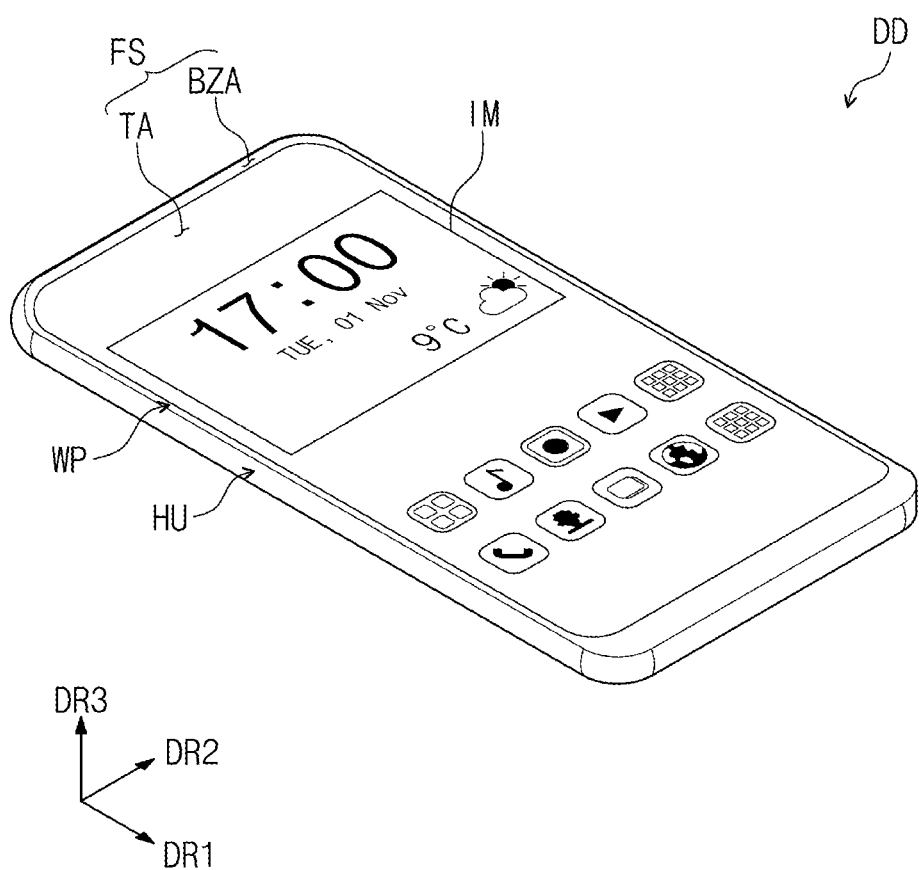
FIG. 1 is a perspective view showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the following descriptions, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "connected directly to" or "coupled directly to" another element or layer, there are no intervening elements present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms, including "at least one," unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

Figure 2:
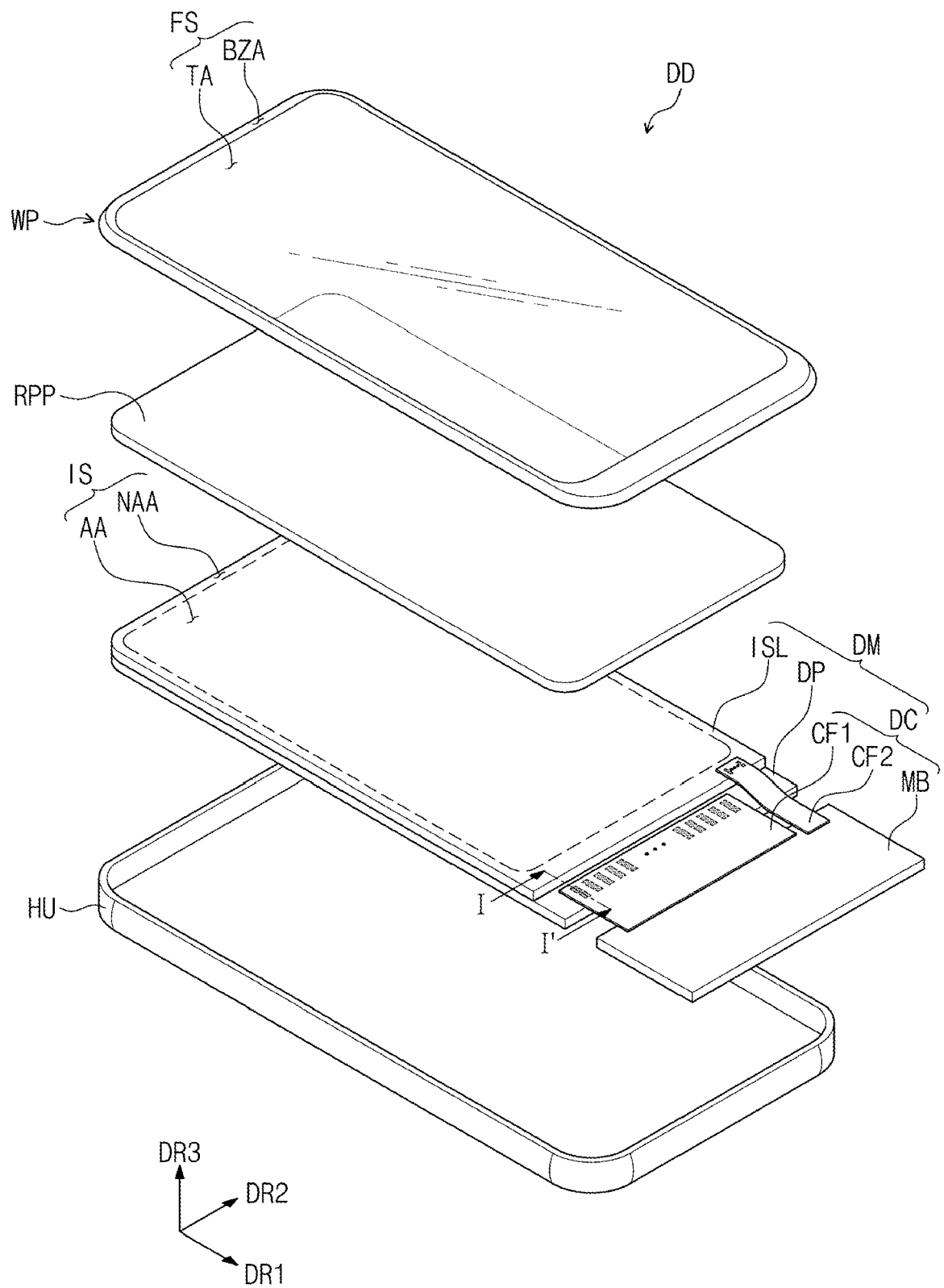
FIG. 2 is an exploded perspective view showing a display device according to an exemplary embodiment of the disclosure.

FIG. 1 is a perspective view showing a display device according to an exemplary embodiment of the disclosure. FIG. 2 is an exploded perspective view showing a display device according to an exemplary embodiment of the disclosure.

Referring to FIGS. 1 and 2, an exemplary embodiment of the display device DD may be a device activated in response to an electrical signal. The display device DD may be applied to various electronic devices, e.g., a large-sized electronic device, such as a television set, a monitor, or an outdoor billboard, and a small and medium-sized electronic item, such as a personal computer, a laptop computer, a personal digital assistants, a navigation unit, a game unit, a mobile electronic device, and a camera, but not being limited thereto. Hereinafter, for convenience of description, exemplary embodiments where the display device DD is a smartphone will be described in detail with reference to FIGS. 1 and 2.

The display device DD displays an image IM through a display surface FS, which is substantially parallel to each of a first direction DR1 and a second direction DR2, toward a third direction DR3. The image IM includes a still image as well as a motion image. FIG. 1 shows a clock application and application icons as a representative example of the image IM. The display surface FS, through which the image IM is displayed, corresponds to a front surface of the display device DD and to a front surface of a window WP. In such an embodiment, the display surface FS may be provided at a side or rear surface of the display device DD depending on a structure of the display device DD.

In an exemplary embodiment, front (or upper) and rear (or lower) surfaces of each member of the display device DD are defined with respect to a direction in which the image IM is displayed. In an exemplary embodiment, the third direction DR3 may be a thickness direction of the display device DD. The front and rear surfaces face each other in the third direction DR3, and a normal line direction of each of the front and rear surfaces is substantially parallel to the third direction DR3. Directions indicated by the first, second, and third directions DR1, DR2, and DR3 are relative to each other, and thus, the directions indicated by the first, second, and third directions DR1, DR2, and DR3 may be changed to other directions. In the following descriptions, the expression "when viewed in a plan view" may mean a state of being viewed in the third direction DR3.

In an exemplary embodiment, the display device DD may sense a user input applied thereto from an outside. The user input may include various types of external inputs, such as a touch by a part of the user's body, light, heat, or a pressure. In an exemplary embodiment, the display device DD may sense the user input applied to the side or rear surface of the display device DD depending on the structure thereof, but not being limited to a specific embodiment.

In an exemplary embodiment, the display device DD includes the window WP, an anti-reflective layer RPP, a display module DM, and a housing HU. In such an embodiment, the window WP and the housing HU are coupled to each other to provide or define an exterior of the display device DD.

The window WP includes an optically transparent insulating material. In one exemplary embodiment, for example, the window WP includes a glass or a plastic material. The window WP has a single-layer or multi-layer structure. In an exemplary embodiment, the window WP includes a plurality of plastic films attached to each other by an adhesive or a glass substrate and a plastic film attached to the glass substrate by an adhesive.

The front surface FS of the window WP defines the front surface of the display device DD as described above. A transmissive area TA may be an optically transparent area. In one exemplary embodiment, for example, the transmissive area TA may be an area having a visible light transmittance of about 90% or greater.

A bezel area BZA may be an area having a relatively low transmittance as compared with the transmissive area TA. The bezel area BZA defines a shape of the transmissive area TA. The bezel area BZA is disposed adjacent to the transmissive area TA and surrounds the transmissive area TA.

The bezel area BZA has a predetermined color. The bezel area BZA covers a peripheral area NAA of the display module DM to prevent the peripheral area NAA from being viewed from the outside. However, this is merely exemplary, and in an alternative exemplary embodiment, the bezel area BZA may be omitted from the window WP.

The anti-reflective layer RPP is disposed under the window WP. The anti-reflective layer RPP reduces a reflectance of an external light incident thereto from above the window WP. The anti-reflective layer RPP may be, but not limited to, a polarizing film. In an alternative exemplary embodiment, the anti-reflective layer RPP may be omitted or may be included in the display module DM.

The display module DM displays the image IM and senses the external input. The display module DM includes a front surface IS in which an active area AA and the peripheral area NAA are defined. The active area AA may be an area activated in response to an electrical signal.

In an exemplary embodiment, the active area AA is an area through which the image IM is displayed and the external input is sensed. The transmissive area TA overlaps at least the active area AA. In one exemplary embodiment, for example, the transmissive area TA overlaps an entire surface or at least a portion of the active area AA. Accordingly, a user perceives the image IM or provides the external input through the transmissive area TA, however, this is merely exemplary. In an exemplary embodiment, an area through which the image IM is displayed and an area through which the external input is sensed may be separated from each other in the active area AA or defined independently of each other in the active area AA, but not being limited to a particular embodiment.

The peripheral area NAA may be covered by the bezel area BZA. The peripheral area NAA may be disposed adjacent to the active area AA. The peripheral area NAA may surround the active area AA. A driving circuit or a driving line may be disposed in the peripheral area NAA to drive the active area AA.

The display module DM includes a display panel DP, an input sensing layer ISL, and a driving circuit DC.

The display panel DP includes a structure or elements to generate the image IM. The image IM generated by the display panel DP is perceived outside by the user through the transmissive area TA.

The input sensing layer ISL senses the external input applied from the outside. In such an embodiment, as described above, the input sensing layer ISL senses the external input applied to the window WP.

The driving circuit DC is electrically connected to the display panel DP and the input sensing layer ISL. The driving circuit DC includes a main circuit board MB, a first circuit board CF1, and a second circuit board CF2.

The first circuit board CF1 is electrically connected to the display panel DP. The first circuit board CF1 connects the display panel DP and the main circuit board MB. In an exemplary embodiment, the first circuit board CF1 may be a flexible circuit film as shown in FIG. 2.

The first circuit board CF1 is connected to pads of the display panel DP, which are disposed in the peripheral area NAA. The first circuit board CF1 provides electrical signals to the display panel DP to drive the display panel DP. The electrical signals are generated by the first circuit board CF1 or the main circuit board MB.

The second circuit board CF2 is electrically connected to the input sensing layer ISL. The second circuit board CF2 electrically connects the input sensing layer ISL to the main circuit board MB. In an exemplary embodiment, the second circuit board CF2 may be a flexible circuit film as shown in FIG. 2, but not being limited thereto. In an alternative exemplary embodiment, the second circuit board CF2 may not be connected to the main circuit board MB or may be omitted. In such an embodiment where the second circuit board CF2 is omitted, the input sensing layer ISL may be electrically connected to the first circuit board CF1.

The second circuit board CF2 is connected to pads of the input sensing layer ISL, which are disposed in the peripheral area NAA. The second circuit board CF2 provides electrical signals to the input sensing layer ISL to drive the input sensing layer ISL. The electrical signals are generated by the second circuit board CF2 or the main circuit board MB.

The main circuit board MB includes various driving circuits to drive the display module DM and a connector to provide a power. The first and second circuit boards CF1 and CF2 are connected to the main circuit board MB. According to an exemplary embodiment of the disclosure, the display module DM is controlled by using a single main circuit board MB, however, this is merely exemplary. In an exemplary embodiment of the display module DM according to the disclosure, the display panel DP and the input sensing layer ISL may be connected to different main circuit boards, respectively, and one of the first and second circuit boards CF1 and CF2 may not be connected to the main circuit board MB, but not being limited to a particular embodiment.

The housing HU is coupled to the window WP. The housing HU is coupled to the window WP to provide an inner space. The display module DM is accommodated in the inner space.

The housing HU includes a material with a relatively high rigidity. In one exemplary embodiment, for example, the housing HU includes a glass, a plastic, or a metal material or is defined by a combination of a plurality of frames and/or plates. The housing HU stably protects the components of the display device DD accommodated in the inner space from external impacts.

In an alternative exemplary embodiment of the display device DD, the window WP or the input sensing layer ISL may be omitted.

Figure 3:
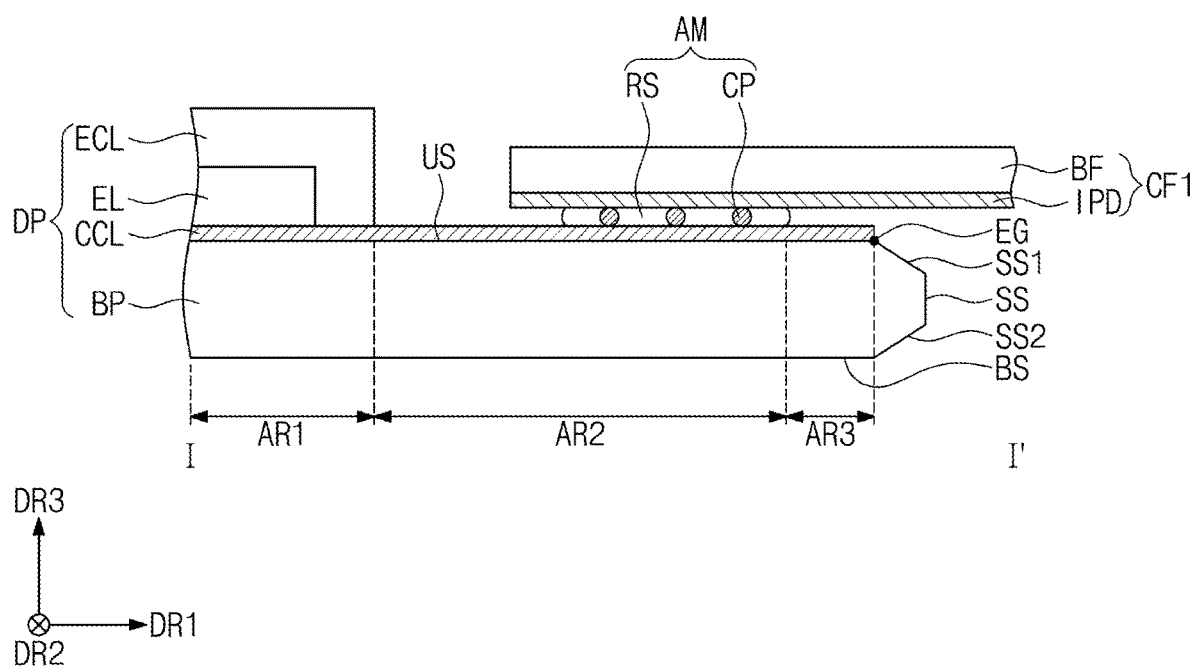
FIG. 3 is a cross-sectional view taken along line I-I' shown in FIG. 2.

FIG. 3 is a cross-sectional view taken along line I-I' shown in FIG. 2. FIG. 3 shows the display panel DP and the first circuit boards CF1, and other components of the display device DD are omitted for convenience of illustration and description.

Referring to FIG. 3, an exemplary embodiment of the display panel DP includes a base substrate BP, a circuit layer CCL, a light emitting element layer EL, and an encapsulation layer ECL.

The base substrate BP may be a base layer on which the circuit layer CCL is disposed. The base substrate BP may have a single-layer structure or a multi-layer structure of a plurality of insulating layers. The base substrate BP may be one of a glass substrate, a plastic substrate, a film, and a stack structure including a plurality of organic layers and/or a plurality of inorganic layers, for example, but not being limited to a specific embodiment.

The base substrate BP includes an upper surface US, a bottom surface BS, a side surface SS, a first slant surface SS1, and a second slant surface SS2. The upper surface US and the bottom surface BS may be substantially parallel to a surface defined by the first direction DR1 and the second direction DR2. The upper surface US and the bottom surface BS may be opposite to each other.

The first slant surface SS1 may extend from the upper surface US and may have a predetermined angle with respect to the upper surface US. In one exemplary embodiment, for example, an angle between the first slant surface SS1 and the upper surface US may not be a right angle, e.g., may be an angle greater than 90 degrees. A boundary between the upper surface US and the first slant surface SS1 may be defined as an edge EG of the base substrate BP.

The side surface SS may extend from the first slant surface SS1. The side surface SS and the upper surface US may form an angle of about 90 degrees.

The second slant surface SS2 may extend from the side surface SS and may connect the side surface SS and the bottom surface BS. An angle between the second slant surface SS2 and the bottom surface BS may not be a right angle. In one exemplary embodiment, for example, the angle between the second slant surface SS2 and the bottom surface BS greater than 90 degrees.

In an exemplary embodiment, the first slant surface SS1 and the second slant surface SS2 may be formed by cutting portions of the base substrate BP and grinding the cut portions. According to an alternative exemplary embodiment of the disclosure, the base substrate BP may not include the first slant surface SS1 and the second slant surface SS2. In such an embodiment, the edge EG of the base substrate BP may be defined at a boundary between the upper surface US and the first slant surface SS1, which are connected to each other.

A first area AR1, a second area AR2, and a third area AR3 are sequentially defined in the base substrate BP along the first direction DR1. In one exemplary embodiment, for example, the first area AR1, the second area AR2, and the third area AR3 may be defined in the upper surface US of the base substrate BP.

The circuit layer CCL may be disposed on the base substrate BP. The circuit layer CCL may have a stack structure of a plurality of conductive layers and a plurality of organic layers and/or inorganic layers. In one exemplary embodiment, for example, the circuit layer CCL may include a plurality of transistors, a plurality of signal lines, and a plurality of insulating layers.

The light emitting element layer EL may be disposed on the circuit layer CCL. The light emitting element layer EL may be electrically connected to a driving element or signal lines of the circuit layer CCL. In an exemplary embodiment, the display panel DP is an organic light emitting display panel, and the light emitting element layer EL may include an organic light emitting layer. In an alternative exemplary embodiment, the display panel DP is a quantum dot light emitting display panel, and the light emitting element layer EL may include a quantum dot or a quantum rod.

The encapsulation layer ECL may be disposed on the light emitting element layer EL and may cover the light emitting element layer EL. The encapsulation layer ECL may protect the light emitting element layer EL. Alternatively, the encapsulation layer ECL may be omitted or may be replaced with an encapsulation substrate depending on the type of the display panel DP.

The first circuit board CF1 may be coupled to a portion of the circuit layer CCL disposed on the second area AR2 of the base substrate BP. The portion of the circuit layer CCL may be, for example, pads.

The first circuit board CF1 may include a base film BF and a connection pad IPD. The base film BF may have a flexibility and an insulating property. The connection pad IPD may be electrically connected to the circuit layer CCL.

The first circuit board CF1 and the display panel DP may be coupled to each other by a conductive adhesive member AM. The conductive adhesive member AM may be disposed on the second area AR2 of the base substrate BP.

The conductive adhesive member AM may have an electrical conductivity and may have an adhesiveness. In one exemplary embodiment, for example, the conductive adhesive member AM may include an anisotropic conductive film ("ACF"). The conductive adhesive member AM may include conductive particles CP and a resin layer RS. The conductive particles CP are distributed in the resin layer RS. The resin layer RS may have an adhesiveness. The resin layer RS may include a heat curable or light curable material.

Figure 4:
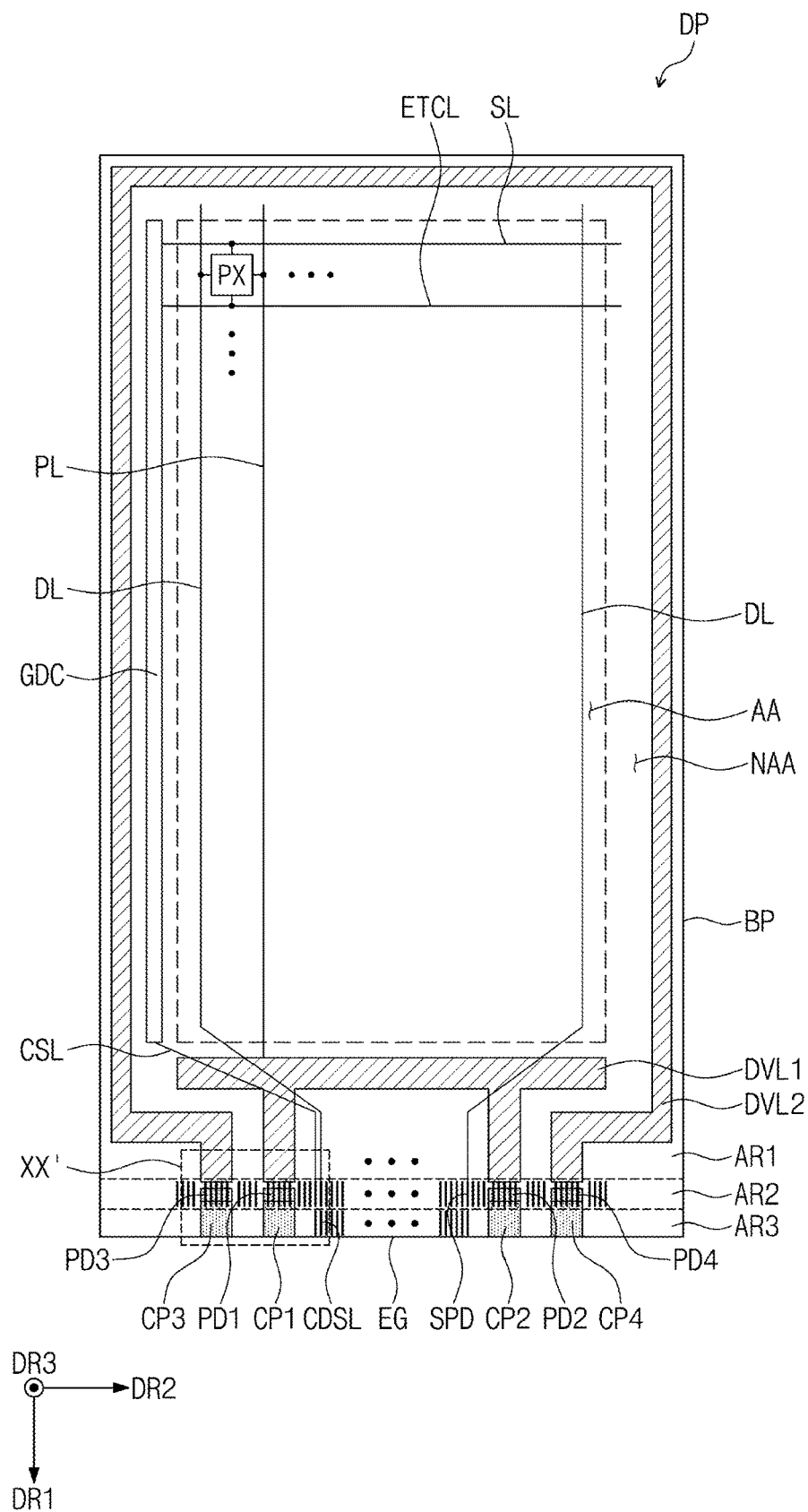
FIG. 4 is a plan view showing a display panel according to an exemplary embodiment of the disclosure.

FIG. 4 is a plan view showing the display panel according to an exemplary embodiment of the disclosure.

Referring to FIG. 4, an exemplary embodiment of the display panel DP may include the base substrate BP, pixels PX, a driving circuit GDC, signal lines SL, ETCL, DL, PL, and CSL, first and second power lines DVL1 and DVL2, signal pads SPD, power pads PD1, PD2, PD3, and PD4, conductive portions CP1, CP2, CP3, and CP4, and conductive lines CDSL. In an exemplary embodiment, the display panel DP may further include dummy pads DMP (shown in FIG. 6A).

The first area AR1, the second area AR2, and the third area AR3 of the base substrate BP are sequentially defined along the first direction DR1. The first area AR1 may overlap an entire active area AA and a portion of the peripheral area NAA. The second area AR2 may overlap another portion of the peripheral area NAA. The third area AR3 may overlap the remaining portion of the peripheral area NAA.

The pixels PX may be disposed on the first area AR1. Each of the pixels PX may display or emit a light having a predetermined color. In an exemplary embodiment, the pixels PX may include red pixels, green pixels, and blue pixels. According to an alternative exemplary embodiment, the pixels PX may further include white pixels. According to another alternative exemplary embodiment, the pixels PX may include cyan pixels, magenta pixels, and yellow pixels.

The driving circuit GDC may be disposed in the peripheral area NAA. The driving circuit GDC may include a scan driving circuit and a light emitting control driving circuit. The scan driving circuit may generate a plurality of scan signals, and the light emitting control driving circuit may generate a plurality of light emitting control signals.

The driving circuit GDC may include a plurality of thin film transistors formed through a same process, e.g., a low temperature polycrystalline silicon ("LTPS") process or a low temperature polycrystalline oxide ("LTPO") process, as a pixel circuit of the pixels PX.

The signal lines SL, DL, CSL, PL, and ETCL may include scan lines SL, light emitting control lines ETCL, data lines DL, power lines PL, and control signal lines CSL.

The scan lines SL may extend in the second direction DR2 and may be arranged in the first direction DR1. The light emitting control lines ETCL may extend in the second direction DR2 and may be arranged in the first direction DR1. In such an embodiment, each of the light emitting control lines ETCL may be arranged to be substantially parallel to a corresponding scan line among the scan lines SL. The scan lines SL receive the scan signals from the driving circuit GDC, and the light emitting control lines ETCL may receive the light emitting control signals from the driving circuit GDC.

The data lines DL may extend in the first direction DR1 and may be arranged in the second direction DR2. The data lines DL may apply data signals to corresponding pixels PX.

The power lines PL may extend in the first direction DR1 and may be arranged in the second direction DR2. The power lines PL may be electrically connected to the first power line DVL1. The power lines PL may apply a first driving voltage to corresponding pixels PX.

The control signal lines CSL may be electrically connected to the driving circuit GDC. The control signal lines CSL may transmit signals to drive the driving circuit GDC.

Each of the first power line DVL1 and the second power line DVL2 may apply the driving voltage to the pixels PX. In one exemplary embodiment, for example, the first power line DVL1 may receive the first driving voltage, e.g., an ELVDD voltage, and may apply the first driving voltage to the pixels PX through the power lines PL. The second power line DVL2 may receive a second driving voltage, e.g., an ELVSS voltage, and may apply the second driving voltage to a second electrode CE (refer to FIG. 5) of the pixels PX. The second driving voltage may have a voltage level lower than that of the first driving voltage.

The signal pads SPD and the power pads PD1, PD2, PD3, and PD4 may be disposed on the second area AR2.

The signal pads SPD may be arranged in the second direction DR2. The signal pads SPD may be connected to some of the signal lines SL, ETCL, DL, PL, and CSL. In one exemplary embodiment, for example, some pads of the signal pads SPD may be connected to the control signal lines CSL, and the other pads of the signal pads SPD may be connected to the data lines DL.

The power pads PD1, PD2, PD3, and PD4 may include a first power pads PD1, a second power pads PD2, a third power pads PD3, and a fourth power pads PD4. The first, second, third, and fourth power pads PD1, PD2, PD3, and PD4 may be arranged in the second direction DR2.

The first power pads PD1 and the second power pads PD2 may be connected to the first power line DVL1, and the third power pads PD3 and the fourth power pads PD4 may be connected to the second power line DVL2.

In an exemplary embodiment, each of the first and second power lines DVL1 and DVL2 may have a width greater than a width of each of the control signal lines CSL and the data lines DL. Accordingly, the number of the pads connected to each of the first and second power lines DVL1 and DVL2 may be greater that the number of the pads connected to each of the control signal lines CSL and the data lines DL.

The conductive portions CP1, CP2, CP3, and CP4 and the conductive lines CDSL may be disposed on the second area AR2 and the third area AR3.

The conductive lines CDSL may be electrically connected to the signal pads SPD and may extend from an area overlapping one end of each of the signal pads SPD toward an edge EG.

The conductive portions CP1, CP2, CP3, and CP4 may include a first conductive portion CP1 electrically connected to the first power pads PD1, a second conductive portion CP2 electrically connected to the second power pads PD2, a third conductive portion CP3 electrically connected to the third power pads PD3, and a fourth conductive portion CP4 electrically connected to the fourth power pads PD4. The first conductive portion CP1 and the second conductive portion CP2 may extend from an area overlapping one end of the first power line DVL1 toward the edge EG. The third conductive portion CP3 and the fourth conductive portion CP4 may extend from an area overlapping one end of the second power line DVL2 toward the edge EG.

Before a manufacture of the display panel is completed, the display panel may further include a test area. The test area may be connected to a lower portion of the third area AR3. Test lines and test pads may be arranged in the test area. The conductive lines CDSL, the first conductive portion CP1, the second conductive portion CP2, the third conductive portion CP3, and the fourth conductive portion CP4 may be electrically connected to the test lines. Then, the test area of the display panel, which is not completed, may be removed by a cutting process.

According to an exemplary embodiment of the disclosure, the area in which the test lines and the test pads are arranged may be removed by the cutting process, and thus, an area of the peripheral area NAA may be reduced. The conductive lines CDSL, the first conductive portion CP1, the second conductive portion CP2, the third conductive portion CP3, and the fourth conductive portion CP4 may remain extended toward the edge EG of the base substrate BP after the cutting process.

When viewed in a plan view, a portion of the first conductive portion CP1 overlaps the first power pads PD1, a portion of the second conductive portion CP2 overlaps the second power pads PD2, a portion of the third conductive portion CP3 overlaps the third power pads PD3, and a portion of the fourth conductive portion CP4 overlaps the fourth power pads PD4. In an exemplary embodiment, openings may be defined through each of the first, second, third, and fourth conductive portions CP1, CP2, CP3, and CP4. The shape of the first, second, third, and fourth conductive portions CP1, CP2, CP3, and CP4 will be described later in greater detail with reference to FIGS. 6A, 7, 8, 9, 10, 11, and 12A.

Figure 5:
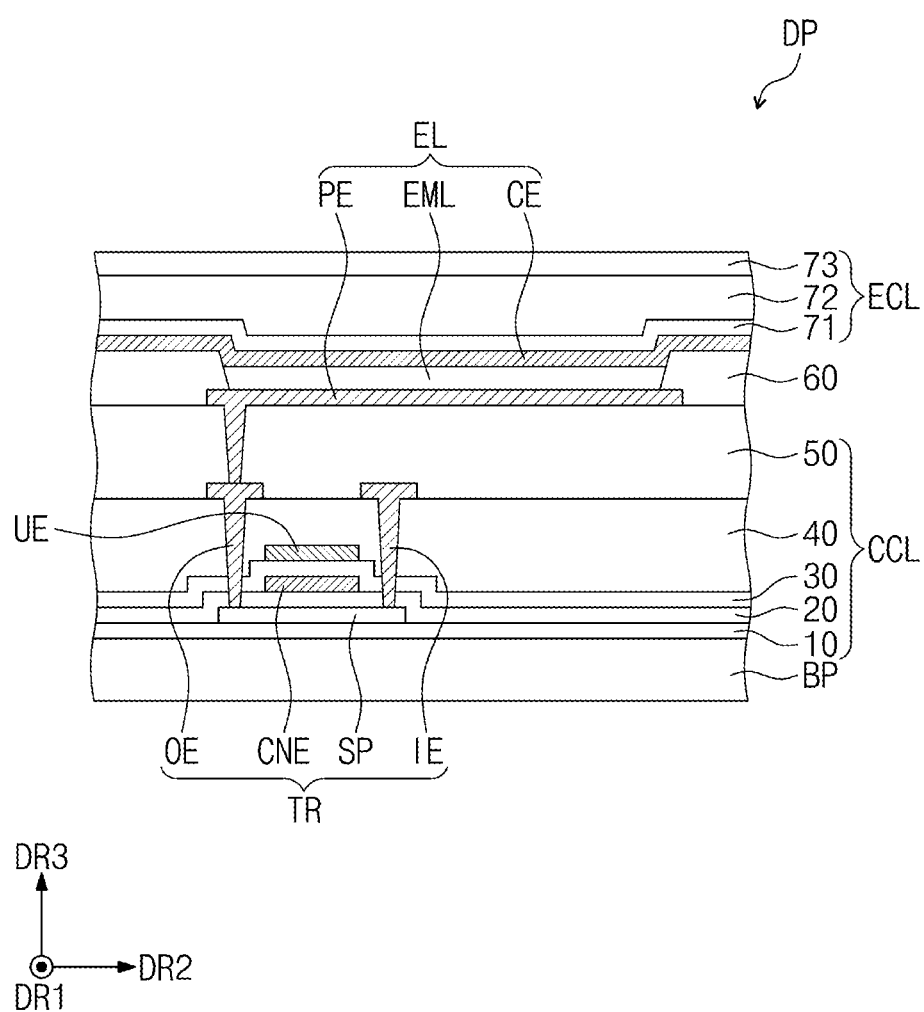
FIG. 5 is a cross-sectional view showing a display panel according to an exemplary embodiment of the disclosure.

FIG. 5 is a cross-sectional view showing the display panel DP according to an exemplary embodiment of the disclosure. FIG. 5 shows a cross-section of a portion of the pixel PX (refer to FIG. 4).

Referring to FIG. 5, an exemplary embodiment of the display panel DP may include the base substrate BP, the circuit layer CCL, the light emitting element layer EL, and the encapsulation layer ECL. Each of the pixels PX (refer to FIG. 4) may include a plurality of transistors, at least one capacitor, and the light emitting element layer EL. The transistors and the capacitor may be included in the circuit layer CCL. FIG. 5 shows one transistor TR among the transistors, for convenience of illustration.

A first layer 10 may be disposed on the base substrate BP. The first layer 10 may include an inorganic material. In one exemplary embodiment, for example, the inorganic material may include at least one material selected from silicon nitride, silicon oxynitride, and silicon oxide. The first layer 10 may include at least one layer selected from a buffer layer and a barrier layer. Accordingly, the transistor TR may be stably disposed on the base substrate BP and may prevent oxygen or moisture introduced through the base substrate BP from infiltrating the pixel PX (refer to FIG. 4).

The transistor TR may be disposed on the first layer 10. The transistor TR may include a semiconductor layer SP, a control electrode CNE, a first electrode IE, and a second electrode OE.

The semiconductor layer SP may be disposed on the first layer 10. The semiconductor layer SP may include a polycrystalline silicon or an amorphous silicon. In an exemplary embodiment, the semiconductor layer SP may include a metal oxide semiconductor. The semiconductor layer SP may include a channel area used as a path through which electrons or holes move, a first ion doping area, and a second ion doping area, and the first and second ion doping areas may be disposed to be spaced apart from each other with the channel area interposed therebetween.

A second layer 20 may be disposed on the first layer 10 and may cover the semiconductor layer SR The second layer 20 may include an inorganic material.

The control electrode CNE may be disposed on the second layer 20. A third layer 30 may be disposed on the second layer 20 and may cover the control electrode CNE. The third layer 30 may include an inorganic material.

An upper electrode UE may be disposed on the third layer 30. The upper electrode UE may form or define the capacitor of the pixel PX (refer to FIG. 4).

A fourth layer 40 may cover the upper electrode UE and may be disposed on the third layer 30. The first electrode IE and the second electrode OE may be disposed on the fourth layer 40. The first electrode IE and the second electrode OE may be connected to the semiconductor layer SP via through-holes defined through the second layer 20, the third layer 30, and the fourth layer 40.

A fifth layer 50 may be disposed on the fourth layer 40 and may cover the first electrode IE and the second electrode OE. In an exemplary embodiment, the fifth layer 50 may have a single-layer or multi-layer structure. In such an embodiment, the single-layer structure may include an organic layer, and the multi-layer structure may include an organic layer and an inorganic layer, which are stacked one on another. The fifth layer 50 may be a planarization layer that provides a flat surface on layer therebelow.

Each of the first layer 10, the second layer 20, the third layer 30, the fourth layer 40, and the fifth layer 50 may be an insulating layer. In an exemplary embodiment, as shown in FIG. 5, each of the first, second, third, fourth, and fifth layers 10, 20, 30, 40, and 50 may have the single-layer structure, but not being limited thereto or thereby. In one alternative exemplary embodiment, for example, at least one selected from the first, second, third, fourth, and fifth layers 10, 20, 30, 40, and 50 may include a plurality of layers.

The light emitting element layer EL may be disposed on the circuit layer CCL. The light emitting element layer EL may include a first electrode PE, a light emitting layer EML, and the second electrode CE.

The first electrode PE may be electrically connected to the transistor TR through the fifth layer 50. In an exemplary embodiment, although not shown in figures, a separate connection electrode may be further disposed between the first electrode PE and the transistor TR. In such an embodiment, the first electrode PE may be electrically connected to the transistor TR through the connection electrode.

A sixth layer 60 may be disposed on the fifth layer 50. The sixth layer 60 is provided with an opening defined therethrough. At least a portion of the first electrode PE may be exposed through the opening. The sixth layer 60 may be a pixel definition layer.

The light emitting layer EML may be disposed on the first electrode PE. The light emitting layer EML may include a light emitting material. In one exemplary embodiment, for example, the light emitting layer EML may include at least one material selected from materials capable of emitting red, green, and blue lights, respectively. The light emitting layer EML may include a fluorescent material or a phosphorescent material. The light emitting layer EML may include an organic light emitting material or an inorganic light emitting material such as quantum dots. The light emitting layer EML may emit the light corresponding to a difference in electric potential between the first electrode PE and the second electrode CE.

The second electrode CE may be disposed on the light emitting layer EML. The second electrode CE may be electrically connected to the second power line DVL2 (refer to FIG. 4). Accordingly, the light emitting element layer EL may receive the second power voltage, e.g., the ELVSS voltage, through the second electrode CE.

The second electrode CE may include a transmissive conductive material or a semi-transmissive conductive material. Accordingly, the light generated by the light emitting layer EML may easily travel to the third direction DR3 after passing through the second electrode CE. However, this is merely exemplary, and in an alternative exemplary embodiment, the light emitting element layer EL may operate in a rear surface light emitting manner in which the first electrode PE includes the transmissive or semi-transmissive material or in a both surface light emitting manner in which the light is emitted to both of the front and rear surfaces, but not being limited to a specific embodiment.

In an exemplary embodiment, although not shown in figures, the light emitting element layer EL may include a functional layer disposed between the light emitting layer EML and the first electrode PE and between the light emitting layer EML and the second electrode CE. The functional layer may control a movement of electric charges introduced into the light emitting layer EML from the first electrode PE and the second electrode CE to improve light efficiency and lifespan of the light emitting element layer EL.

The encapsulation layer ECL may be disposed on the light emitting element layer EL to encapsulate the light emitting element layer EL. In an exemplary embodiment, although not shown in figures, a capping layer may be further disposed between the second electrode CE and the encapsulation layer ECL to cover the second electrode CE.

In an exemplary embodiment, the encapsulation layer ECL may include a first inorganic layer 71, an organic layer 72, and a second inorganic layer 73, which are sequentially stacked in the third direction DR3, but not being limited thereto or thereby. Alternatively, the encapsulation layer ECL may further include a plurality of inorganic layers and a plurality of organic layers.

The first inorganic layer 71 may cover the second electrode CE. The first inorganic layer 71 may prevent external moisture or oxygen from entering the light emitting element layer EL. In one exemplary embodiment, for example, the first inorganic layer 71 may include at least one material selected from silicon nitride, silicon oxide, and a compound thereof. The first inorganic layer 71 may be formed by a deposition process.

The organic layer 72 may be disposed on the first inorganic layer 71 to make contact with the first inorganic layer 71 or directly on the first inorganic layer 71. The organic layer 72 may provide a flat surface on the first inorganic layer 71. An uneven shape formed on the upper surface of the first inorganic layer 71 and particles existing on the first inorganic layer 71 may be covered by the organic layer 72, and thus, an influence caused by a surface state of the upper surface of the first inorganic layer 71 on components on the organic layer 72 may be effectively prevented. The organic layer 72 may include an organic material and may be formed by a solution process, such as a spin coating, slit coating, or inkjet process.

The second inorganic layer 73 may be disposed on the organic layer 72 to cover the organic layer 72. The second inorganic layer 73 may be stably formed on a relatively flat surface of the second organic layer 72 when compared with being disposed on the first inorganic layer 71. The second inorganic layer 73 may prevent external moisture or oxygen from entering the light emitting element layer EL. The second inorganic layer 73 may include at least one material selected from silicon nitride, silicon oxide, and a compound thereof. The second inorganic layer 73 may be formed by a deposition process.

Figure 6A:
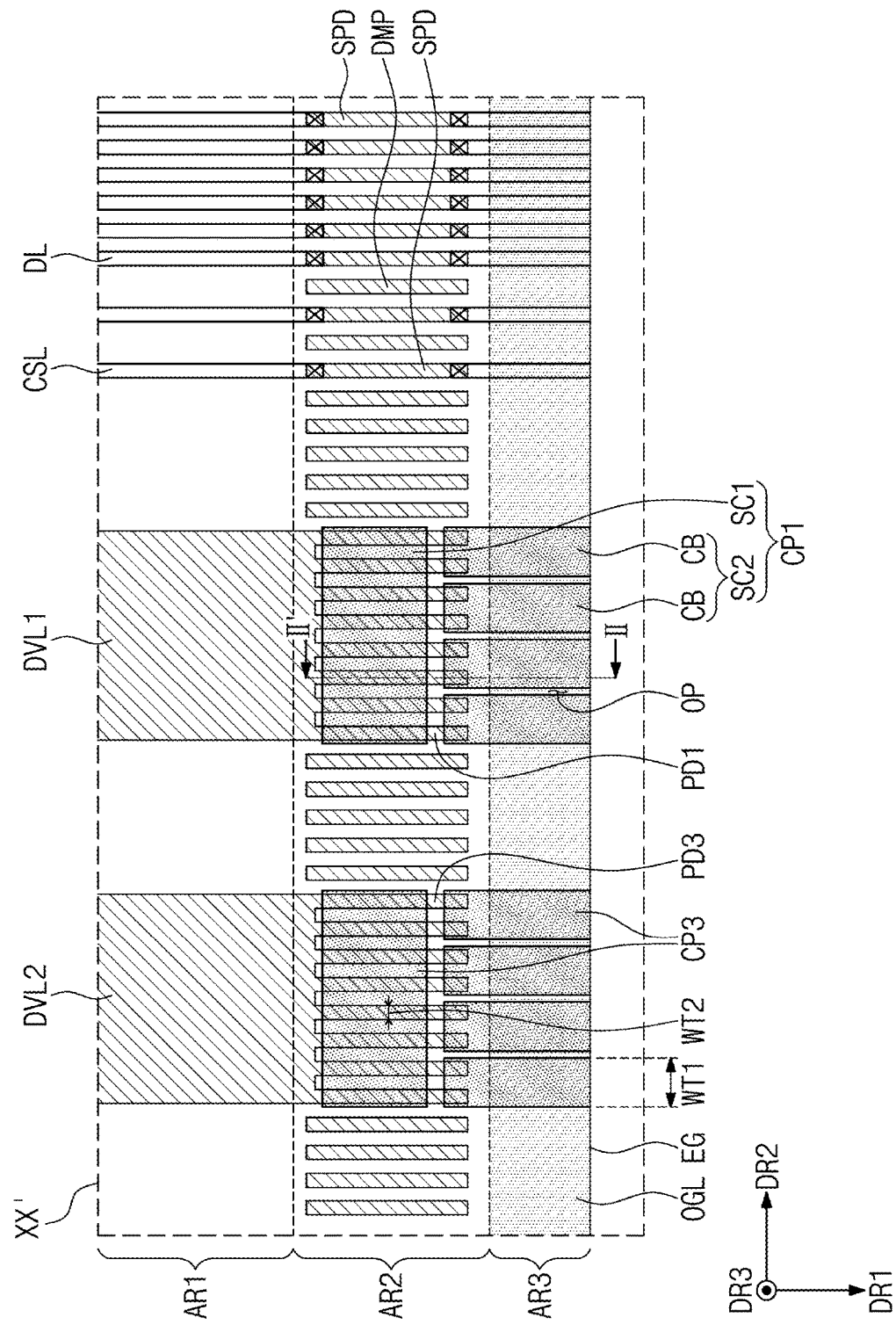
FIG. 6A is a plan view of a display panel according to an exemplary embodiment of the disclosure corresponding to an enlarged plan view of an area XX' shown in FIG. 4.
Figure 6B:
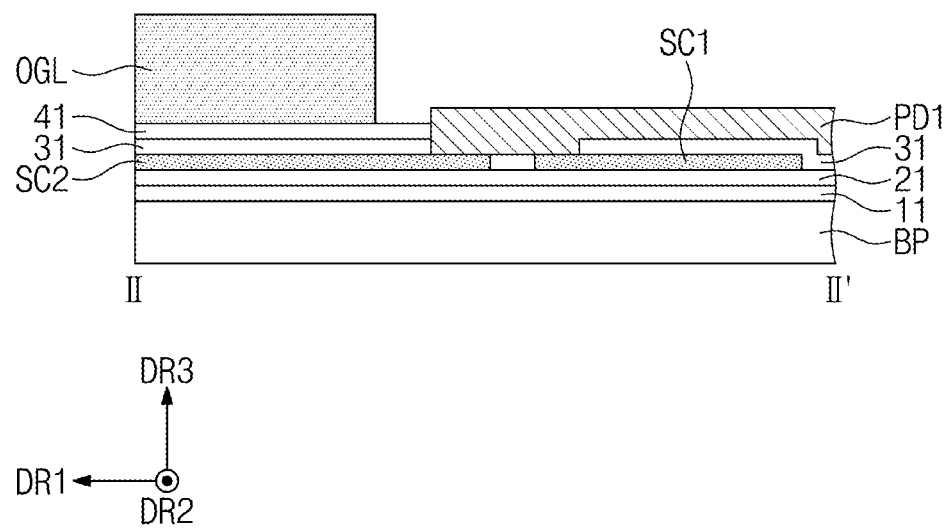
FIG. 6B is a cross-sectional view taken along line II-II' shown in FIG. 6A.

FIG. 6A is a plan view of the display panel according to an exemplary embodiment of the disclosure corresponding to an enlarged plan view of an area XX' shown in FIG. 4. FIG. 6B is a cross-sectional view taken along line II-II' shown in FIG. 6A.

Referring to FIGS. 4, 6A, and 6B, in an exemplary embodiment of the display panel DP, the width of the first power line DVL1 may be greater than the width of each of the first power pads PD1. In such an embodiment, the width of the second power line DVL2 may be greater than the width of each of the third power pads PD3. The width indicates a width measured in a direction substantially parallel to the second direction DR2. In such an embodiment, the second power pads PD2 is substantially the same as the first power pads PD1, and the fourth power pads PD4 is substantially the same as the third power pads PD3. Accordingly, for convenience of description, the first power pads PD1 and the third power pads PD3 will hereinafter be mainly described, and any repetitive detailed descriptions of the second and fourth power pads PD2 and PD4 will be omitted.

The first power line DVL1 may be connected to the first power pads PD1, and the second power line DVL2 may be connected to the third power pads PD3. In one exemplary embodiment, for example, the first power line DVL1 is connected to eight first power pads PD1 and the second power line DVL2 is connected to eight third power pads PD3, as shown in FIG. 6A. However, the number of the power pads connected to one power line are not be limited thereto or thereby, but may be variously modified.

The portion of the first conductive portion CP1 may overlap the first power pads PD1, the portion of the second conductive portion CP2 may overlap the second power pads PD2, the portion of the third conductive portion CP3 may overlap the third power pads PD3, and the portion of the fourth conductive portion CP4 may overlap the fourth power pads PD4. The first conductive portion CP1 may include a conductive material. In one exemplary embodiment, for example, the conductive material may include at least one material selected from molybdenum (Mo), copper (Cu), gold (Au), silver (Ag), aluminum (Al), titanium (Ti), and a combination (e.g., an alloy) thereof.

The first conductive portion CP1 may include a first sub-conductive portion SC1 and a second sub-conductive portion SC2. The first sub-conductive portion SC1 may be disposed on the second area AR2, and the first sub-conductive portion SC1 may be electrically connected to plural first power pads PD1. The second sub-conductive portion SC2 may be disposed on the third area AR3 and may be electrically connected to the first sub-conductive portion SC1 and the first power pads PD1. In an alternative exemplary embodiment of the disclosure, the first sub-conductive portion SC1 may be omitted. In such an embodiment where the first sub-conductive portion SC1 is omitted, the second sub-conductive portion SC2 may be referred to as a conductive portion.

The first sub-conductive portion SC1 and the second sub-conductive portion SC2 may be disposed on the base substrate BP. In one exemplary embodiment, for example, a first layer 11 may be disposed on the base substrate BP, a second layer 21 may be disposed on the first layer 11, and the first sub-conductive portion SC1 and the second sub-conductive portion SC2 may be disposed on the second layer 21, as shown in FIG. 6B. The first layer 11 and the second layer 21 may include an inorganic material. In one exemplary embodiment, for example, the first layer 11 may include silicon oxide and silicon nitride, and the second layer 21 may include silicon oxide.

Since each of the second, third, and fourth conductive portions CP2, CP3, and CP4 is substantially the same as the first conductive portion CP1, any repetitive detailed description thereof will hereinafter be omitted for convenience of description.

A third layer 31 may be disposed on the second layer 21 and may cover a portion of each of the first sub-conductive portion SC1 and the second sub-conductive portion SC2. The third layer 31 may include an inorganic material, for example, silicon nitride. A fourth layer 41 may be disposed on the third layer 31. The fourth layer 41 may include an inorganic material, for example, silicon oxide and silicon nitride.

The first power pads PD1 may be disposed on the third layer 31. The first power pads PD1 may make contact with the first sub-conductive portion SC1 and the second sub-conductive portion SC2, which are not covered by the third layer 31.

A plurality of openings OP may be defined in the second sub-conductive portion SC2. In one exemplary embodiment, for example, each of the openings OP may extend in the first direction DR1. The second sub-conductive portion SC2 may include a plurality of conductive bars CB. The conductive bars CB may be spaced apart from each other by the openings OP. In one exemplary embodiment, for example, the conductive bars CB may be spaced apart from each other in the second direction DR2. In such an embodiment, the conductive bars CB may extend in the first direction DR1.

Each of the conductive bars CB may have a first width WT1 greater than a second width WT2 of each of the first power pads PD1. In one exemplary embodiment, for example, the first width WT1 may be two times or more greater than the second width WT2. Accordingly, a portion of each of the conductive bars CB may overlap at least two first power pads PD1. In such an embodiment, the number of the conductive bars CB may be less than the number of the first power pads PD1. In one exemplary embodiment, for example, the number of the conductive bars CB may be four, and the number of the first power pads PD1 may be eight. However, the number of the conductive bars CB and the number of the first power pads PD1 are not be limited thereto or thereby, but may be variously modified.

The display panel DP may further include an organic layer OGL that covers the first, second, third, and fourth conductive portions CP1, CP2, CP3, and CP4. The organic layer OGL may be disposed on the third area AR3. The organic layer OGL may extend in the second direction DR2. The organic layer OGL may be disposed adjacent to the edge EG of the base substrate BP.

The organic layer OGL may have a first thickness greater than a second thickness of each of the first, second, third, and fourth conductive portions CP1, CP2, CP3, and CP4. In one exemplary embodiment, for example, the first thickness may be about five times greater than the second thickness. In such an embodiment, the first thickness may be about 14,000 angstroms, and the second thickness may be about 2,800 angstroms, for example, but not being limited thereto or thereby.

During a testing or evaluation of reliability of the display panel DP, a phenomenon in which the second sub-conductive portion SC2 adjacent to the edge EG is lifted (hereinafter, referred to as a "peeling phenomenon") may occur. The reliability evaluation may be an experiment in which the display panel DP is left for about 240 hours at a temperature of about 85° C. and a humidity of about 85%. If the second conductive portion SC2 is lifted, moisture may penetrate into the lifted space, and as a result, the conductive materials may be corroded.

If the first conductive portion is connected in the form of a single integral electrode from the edge EG to the first power pads PD1, the peeling phenomenon may proceed in the first direction DR1 and the second direction DR2. However, according to an exemplary embodiment of the disclosure, the openings OP may be defined or provided in the second sub-conductive portion SC2 adjacent to the edge EG. Therefore, even though the peeling phenomenon occurs in a portion of the second sub-conductive portion SC2, the peeling phenomenon may be effectively prevented from proceeding in the second direction DR2. In such an embodiment of the disclosure, the organic layer OGL may be disposed on the second sub-conductive portion SC2 adjacent to the edge EG, and the organic layer OGL may serve to press the second sub-conductive portion SC2. Therefore, the probability that the second sub-conductive portion SC2 is lifted and the probability that the peeling phenomenon occurring in the second sub-conductive portion SC2 is expanded may be reduced. Thus, the reliability of the display device DD may be improved.

Figure 7:
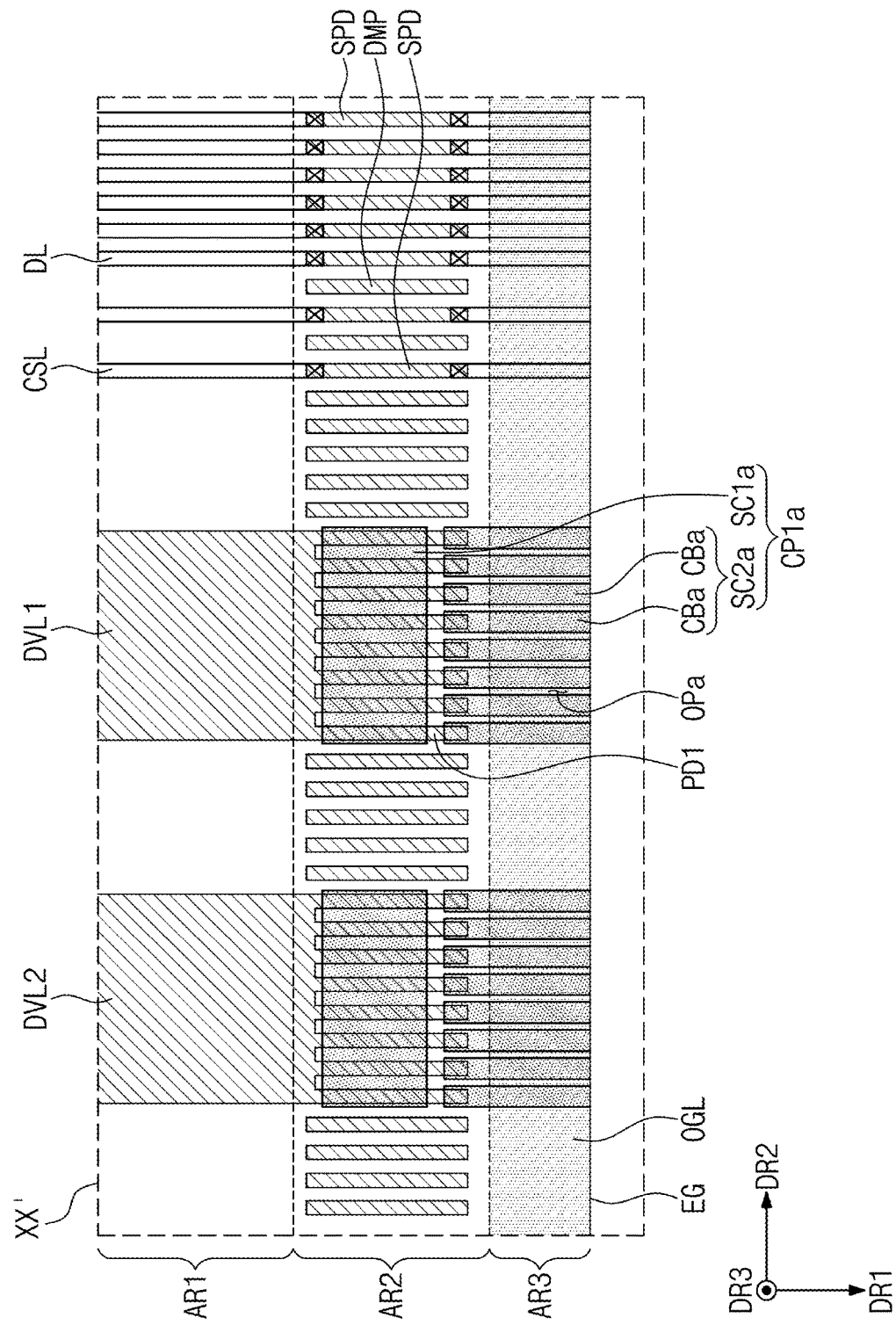
FIG. 7 is a plan view of a display panel according to an alternative exemplary embodiment of the disclosure corresponding to an enlarged plan view of an area XX' shown in FIG. 4.

FIG. 7 is a plan view of a display panel according to an alternative exemplary embodiment of the disclosure corresponding to an enlarged plan view of an area XX' shown in FIG. 4.

The plan view in FIG. 7 is substantially the same as the plan view shown in FIG. 6A except for the conductive portions. The same or like elements shown in FIG. 7 have been labeled with the same reference characters as used above to describe the exemplary embodiments of the display panel with reference to FIGS. 4, 6A and 6B, and any repetitive detailed description thereof will hereinafter be omitted or simplified.

Referring to FIGS. 4 and 7, in an exemplary embodiment, a first conductive portion CP1$a$ may include a first sub-conductive portion SC1$a$ and a second sub-conductive portion SC2$a$. The first sub-conductive portion SC1$a$ may be disposed on a second area AR2 and may be disposed between first power pads PD1 and a base substrate BP. The second sub-conductive portion SC2$a$ may be disposed on a third area AR3 and may be electrically connected to the first sub-conductive portion SC1$a$ and the first power pads PD1.

A plurality of openings OPa may be defined in the second sub-conductive portion SC2$a$. In one exemplary embodiment, for example, each of the openings OPa may extend in the first direction DR1. The second sub-conductive portion SC2$a$ may include a plurality of conductive bars CBa. The conductive bars CBa may be spaced apart from each other by the openings OPa.

In such an embodiment, the number of the openings OPa may be greater than the number of the openings OP in the exemplary embodiment described above with reference to FIG. 6A. Accordingly, the number of the conductive bars CBa may be greater than the number of conductive bars CB shown in FIG. 6A. In such an embodiment, a width of each of the conductive bars CBa may be less than the width of each of the conductive bars CB shown in FIG. 6A.

Figure 8:
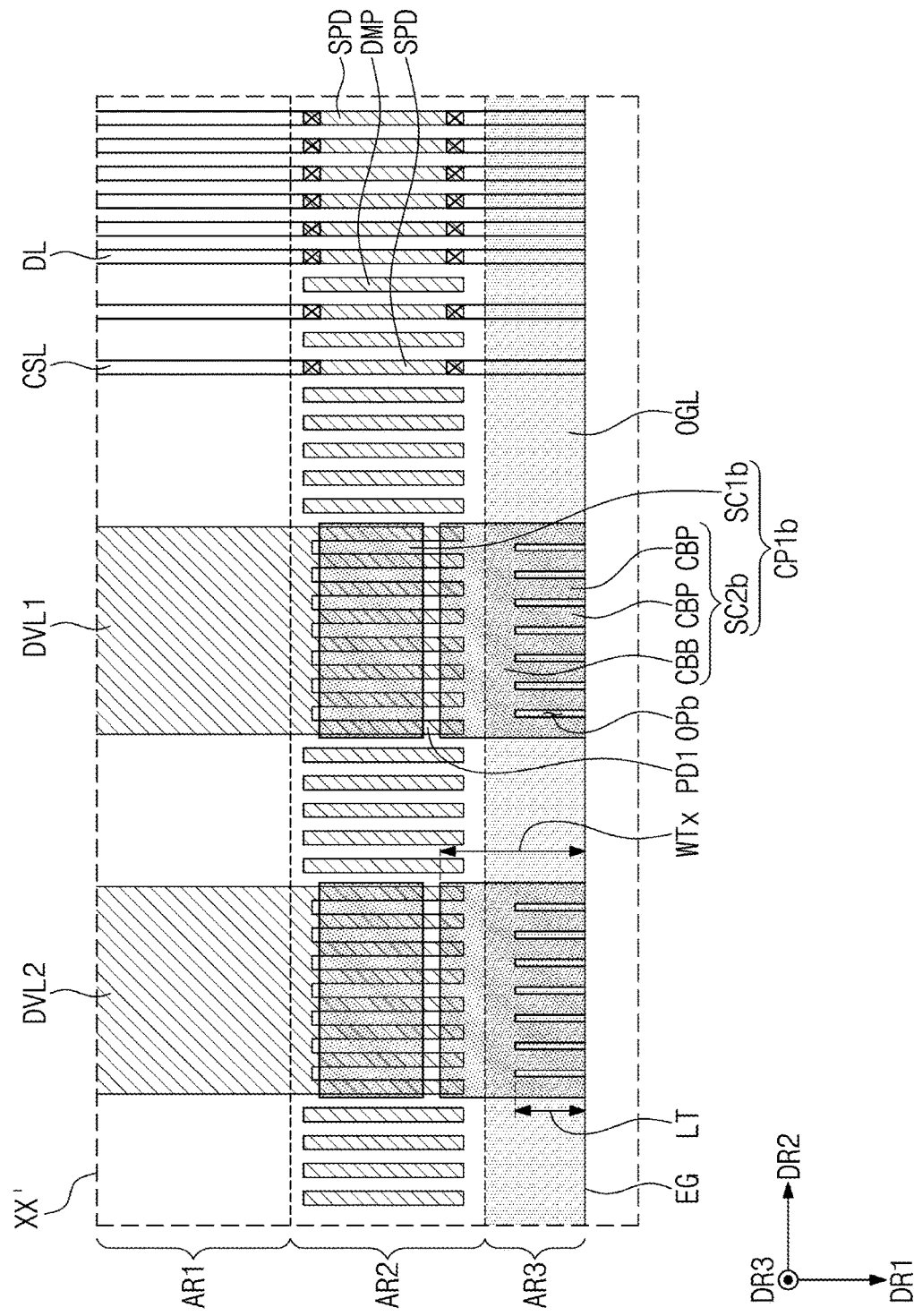
FIG. 8 is a plan view of a display panel according to another alternative exemplary embodiment of the present disclosure corresponding to an enlarged plan view of an area XX' shown in FIG. 4.

FIG. 8 is a plan view of a display panel according to another alternative exemplary embodiment of the disclosure corresponding to an enlarged plan view of an area XX' shown in FIG. 4.

The plan view in FIG. 8 is substantially the same as the plan view shown in FIG. 6A except for the conductive portions. The same or like elements shown in FIG. 8 have been labeled with the same reference characters as used above to describe the exemplary embodiments of the display panel with reference to FIGS. 4, 6A and 6B, and any repetitive detailed description thereof will hereinafter be omitted or simplified.

Referring to FIGS. 4 and 8, in an exemplary embodiment, a first conductive portion CP1$b$ may include a first sub-conductive portion SC1$b$ and a second sub-conductive portion SC2$b$. The first sub-conductive portion SC1$b$ may be disposed on a second area AR2 and may be disposed between first power pads PD1 and a base substrate BP. The second sub-conductive portion SC2$b$ may be disposed on a third area AR3 and may be electrically connected to the first sub-conductive portion SC1$b$ and the first power pads PD1.

A plurality of openings OPb may be defined in the second sub-conductive portion SC2$b$. Each of the openings OPb may extend in the first direction DR1. Each of the openings OPb may extend from an area adjacent to the edge EG to a direction away from the edge EG. A length LT in the first direction DR1 of each of the openings OPb may be shorter than a maximum width WTx in the first direction DR1 of the second sub-conductive portion SC2$b$.

The second sub-conductive portion SC2$b$ may include a conductive body CBB and conductive protrusions CBP protruding from the conductive body CBB to the edge EG. The conductive protrusions CBP may be connected to the conductive body CBB. A length in the first direction DR1 of each of the conductive protrusions CBP may be defined by each of the openings OPb.

Figure 9:
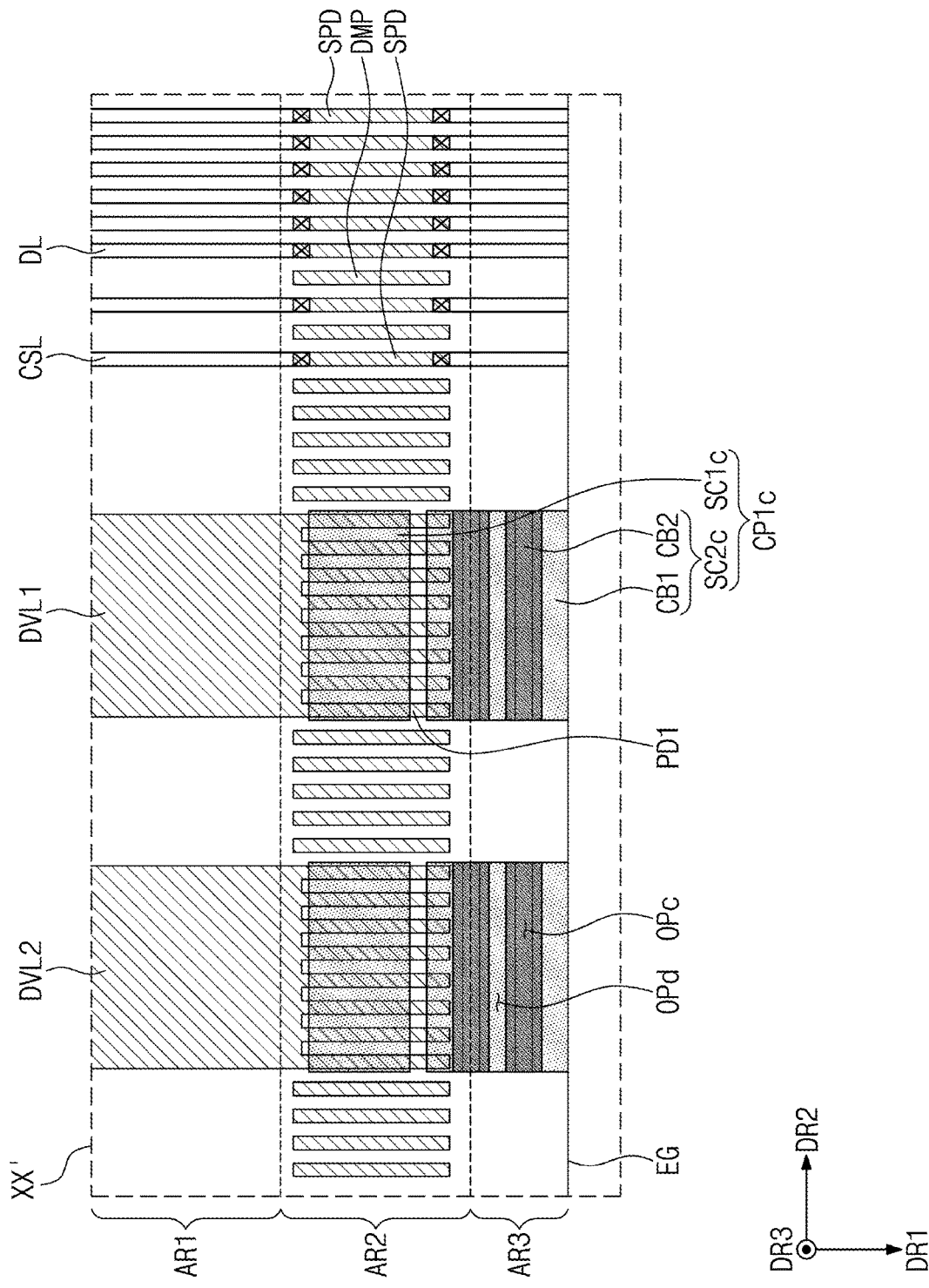
FIG. 9 is a plan view of a display panel according to another alternative exemplary embodiment of the disclosure corresponding to an enlarged plan view of an area XX' shown in FIG. 4.

FIG. 9 is a plan view of a display panel according to another alternative exemplary embodiment of the disclosure corresponding to an enlarged plan view of an area XX' shown in FIG. 4.

The plan view in FIG. 9 is substantially the same as the plan view shown in FIG. 6A except for the conductive portions. The same or like elements shown in FIG. 9 have been labeled with the same reference characters as used above to describe the exemplary embodiments of the display panel with reference to FIGS. 4, 6A and 6B, and any repetitive detailed description thereof will hereinafter be omitted or simplified.

Referring to FIGS. 4 and 9, in an exemplary embodiment, a first conductive portion CP1$c$ may include a first sub-conductive portion SC1$c$ and a second sub-conductive portion SC2$c$. The first sub-conductive portion SC1$c$ may be disposed on a second area AR2 and may be disposed between first power pads PD1 and a base substrate BP. The second sub-conductive portion SC2$c$ may be disposed on a third area AR3 and may be electrically connected to the first sub-conductive portion SC1$c$ and the first power pads PD1.

The second sub-conductive portion SC2$c$ may include first conductive bars CB1 and second conductive bars CB2. The first conductive bars CB1 and the second conductive bars CB2 may be disposed in different layers from each other. In one exemplary embodiment, for example, the first conductive bars CB1 may be disposed in a same layer as the first sub-conductive portion SC1$c$, and the second conductive bars CB2 may be disposed in a same layer as the first power pads PD1.

Openings OPc and OPd may be defined in the second sub-conductive portion SC2$c$. The openings OPc and OPd may be divided into first openings OPc defined between the first conductive bars CB1 and second openings OPd defined between the second conductive bars CB2. Each of the first openings OPc and the second openings OPd may extend in the second direction DR2.

Each of the first conductive bars CB1 and the second conductive bars CB2 may extend in the second direction DR2. In such an embodiment, the first conductive bars CB1 and the second conductive bars CB2 may be alternately arranged with each other in the first direction DR1. In one exemplary embodiment, for example, one first conductive bar CB1 and one second conductive bar CB2 may be alternately arranged with each other. In such an embodiment, the first conductive bars CB1 and the second conductive bars CB2 may be electrically connected to each other.

If the second sub-conductive portion SC2$c$ adjacent to the edge EG is peeled off from the base substrate BP, the second sub-conductive portion SC2$c$ may be peeled off in a direction away from the edge EG from an area adjacent to the edge EG, e.g., a direction parallel to the first direction DR1. According to an exemplary embodiment of the disclosure, the first conductive bars CB1 and the second conductive bars CB2 may be disposed in different layers from each other and may be alternately arranged with each other in the first direction DR1. Accordingly, the peeling phenomenon may be effectively prevented from proceeding toward the second area AR2. Thus, the reliability of the display device DD may be improved.

Figure 10:
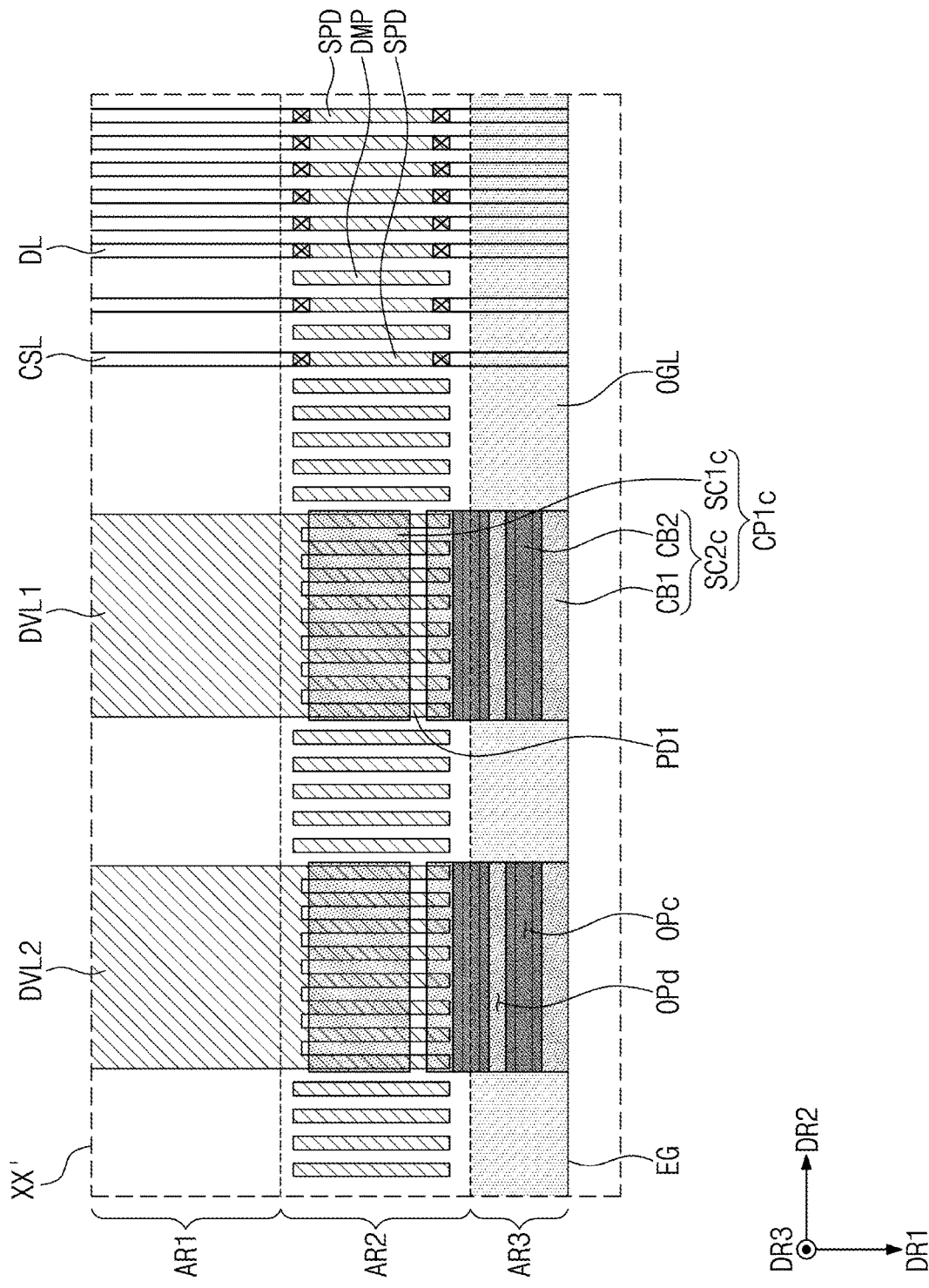
FIG. 10 is a plan view of a display panel according to another alternative exemplary embodiment of the disclosure corresponding to an enlarged plan view of an area XX' shown in FIG. 4.

FIG. 10 is a plan view of a display panel according to another alternative exemplary embodiment of the disclosure corresponding to an enlarged plan view of an area XX' shown in FIG. 4.

The plan view in FIG. 10 is substantially the same as the plan view shown in FIG. 9 except for an organic layer. The same or like elements shown in FIG. 10 have been labeled with the same reference characters as used above to describe the exemplary embodiments of the display panel with reference to FIGS. 4, 6A, 6B and 9, and any repetitive detailed description thereof will hereinafter be omitted or simplified.

Referring to FIGS. 4 and 10, in an exemplary embodiment, an organic layer OGL may be disposed in a third area AR3 adjacent to the edge EG. The organic layer OGL may be disposed on the second sub-conductive portion SC2c. The organic layer OGL may serve to press the second sub-conductive portion SC2c. Therefore, the probability that the second sub-conductive portion SC2 is peeled off may be reduced. Thus, the reliability of the display device DD may be improved.

Figure 11:
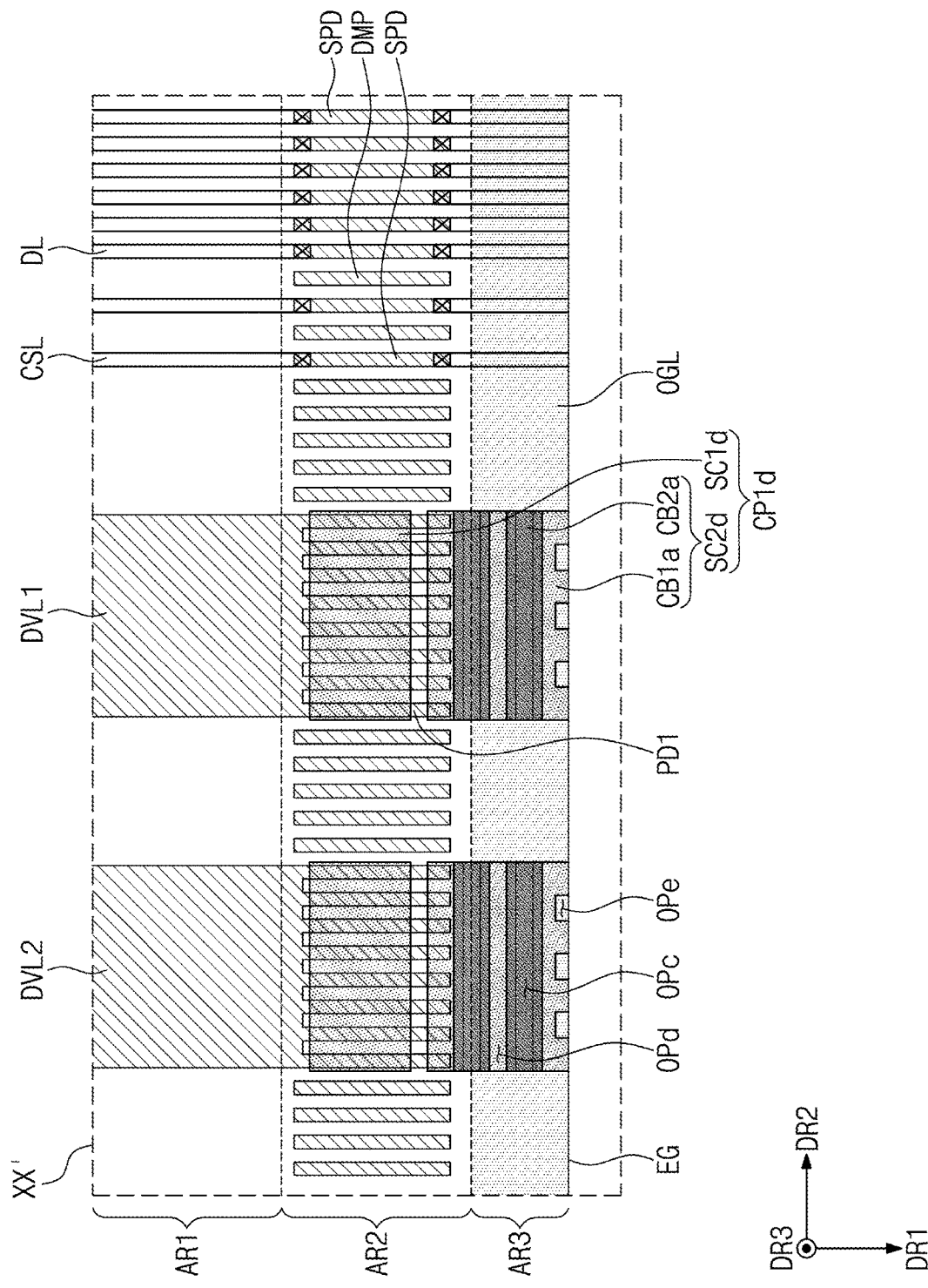
FIG. 11 is a plan view of a display panel according to another alternative exemplary embodiment of the disclosure corresponding to an enlarged plan view of an area XX' shown in FIG. 4.

FIG. 11 is a plan view of a display panel according to another alternative exemplary embodiment of the disclosure corresponding to an enlarged plan view of an area XX' shown in FIG. 4.

The plan view in FIG. 11 is substantially the same as the plan view shown in FIG. 9 except for the conductive portions. The same or like elements shown in FIG. 11 have been labeled with the same reference characters as used above to describe the exemplary embodiments of the display panel with reference to FIGS. 4, 6A, 6B, 9 and 10, and any repetitive detailed description thereof will hereinafter be omitted or simplified.

Referring to FIGS. 4 and 11, a first conductive portion CP1d may include a first sub-conductive portion SC1d and a second sub-conductive portion SC2d. The first sub-conductive portion SC1d may be disposed on a second area AR2 and may be disposed between first power pads PD1 and a base substrate BP. The second sub-conductive portion SC2d may be disposed on a third area AR3 and may be electrically connected to the first sub-conductive portion SC1d and the first power pads PD1. The second sub-conductive portion SC2d may include first conductive bars CB1a and second conductive bars CB2a. The first conductive bars CB1a and the second conductive bars CB2a may be disposed in different layers from each other. In one exemplary embodiment, for example, the first conductive bars CB1a may be disposed in a same layer as the first sub-conductive portion SC1d, and the second conductive bars CB2a may be disposed in a same layer as the first power pads PD1.

Each of the first conductive bars CB1a and the second conductive bars CB2a may extend in the second direction DR2. In such an embodiment, the first conductive bars CB1a and the second conductive bars CB2a may be alternately arranged with each other in the first direction DR1.

Third openings OPe may be further defined in the conductive bar closest to the edge EG among the first conductive bars CB1a and the second conductive bars CB2a. The third openings OPe may be arranged corresponding to a direction in which the edge EG extends. In one exemplary embodiment, for example, the third openings OPe may be arranged in the second direction DR2. According to an exemplary embodiment of the disclosure, even though the peeling phenomenon occurs in a portion of the second sub-conductive portion SC2d adjacent to the edge EG, the peeling phenomenon may be prevented from proceeding in the first direction DR1 and the second direction DR2. The proceeding of the peeling phenomenon in the first direction DR1 may be effectively prevented by the first conductive bars CB1a and the second conductive bars CB2a, which are disposed in different layers, and the proceeding of the peeling phenomenon in the second direction DR2 may be effectively prevented by the third openings OPe defined adjacent to the edge EG. Thus, the reliability of the display device DD may be improved.

Figure 12A:
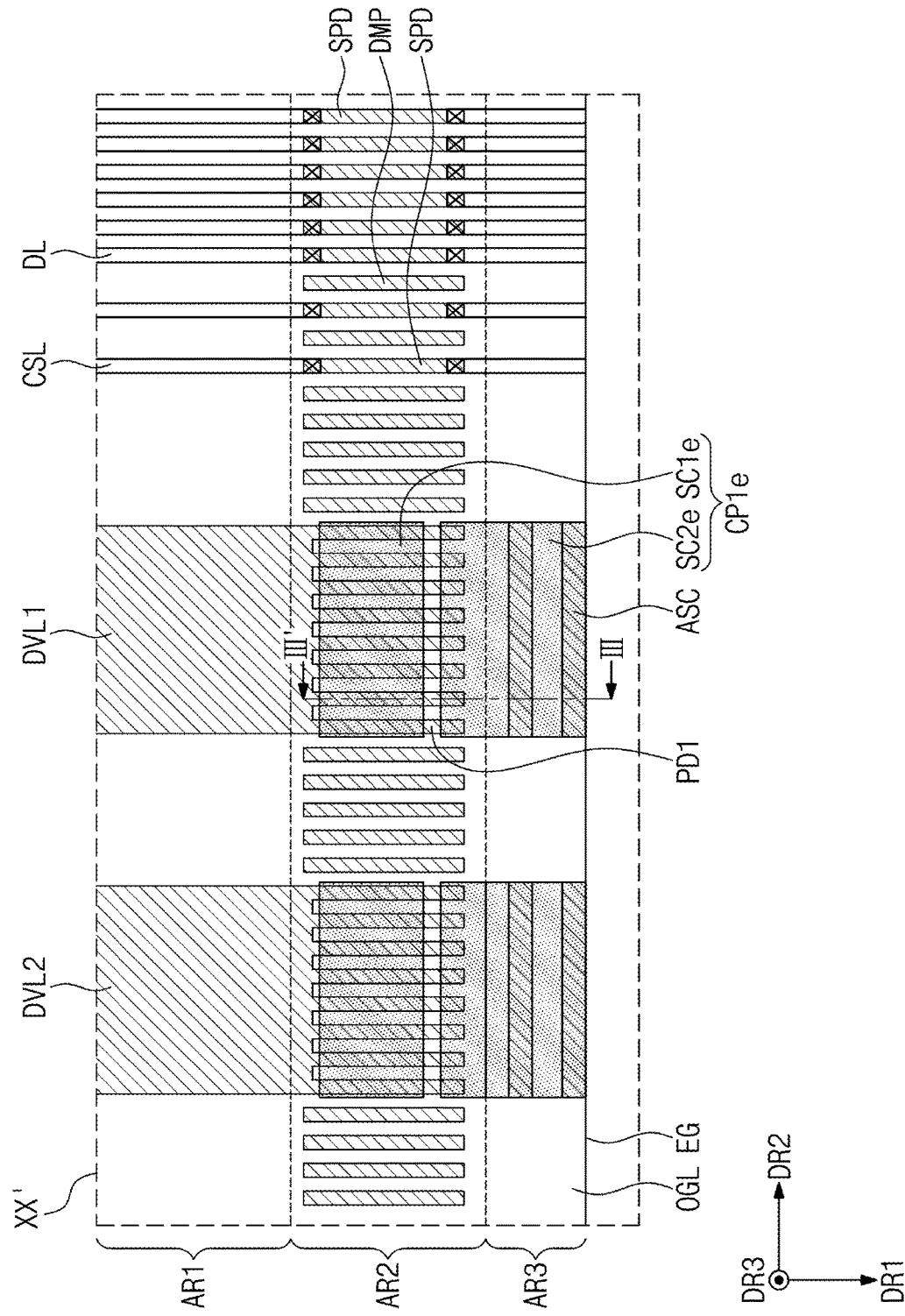
FIG. 12A is a plan view of a display panel according to another alternative exemplary embodiment of the disclosure corresponding to an enlarged plan view of an area XX' shown in FIG. 4.
Figure 12B:
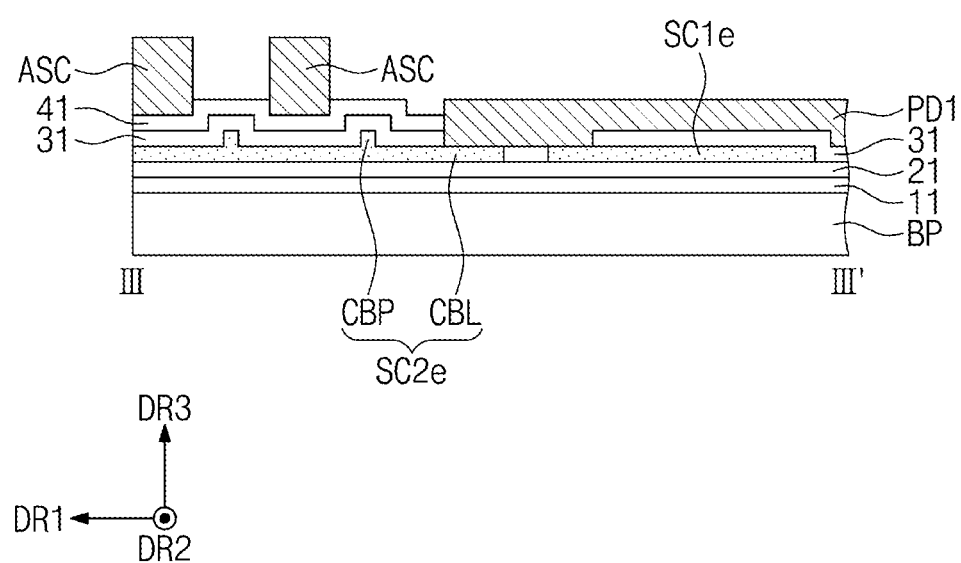
FIG. 12B is a cross-sectional view taken along line shown in FIG. 12A.

FIG. 12A is a plan view of a display panel according to another alternative exemplary embodiment of the disclosure corresponding to an enlarged plan view of an area XX' shown in FIG. 4. FIG. 12B is a cross-sectional view taken along line shown in FIG. 12A.

Referring to FIGS. 4, 12A and 12B, in an exemplary embodiment, a first conductive portion CP1e may include a first sub-conductive portion SC1e and a second sub-conductive portion SC2e. The first sub-conductive portion SC1e may be disposed on a second area AR2 and may be disposed between first power pads PD1 and a base substrate BP. The second sub-conductive portion SC2e may be disposed on a third area AR3 and may be electrically connected to the first sub-conductive portion SC1e and the first power pads PD1. The second sub-conductive portion SC2e may include a conductive layer CBL and protrusions CBP. The conductive layer CBL may be disposed on a second layer 21, and the protrusions CBP may protrude from the conductive layer CBL. In one exemplary embodiment, for example, the protrusions CBP may include substantially a same material as the conductive layer CBL and may be integrally formed as a single unitary unit with the conductive layer CBL. In an exemplary embodiment of the disclosure, each opening may correspond to a space between two adjacent protrusions CBP. In such an embodiment, the opening may be provided in a groove form defined by removing a portion of the second sub-conductive portion SC2e in a thickness direction, i.e., the third direction DR3.

A third layer 31 may be disposed on the second layer 21 and may cover a portion of each of the first sub-conductive portion SC1e and the second sub-conductive portion SC2e. The third layer 31 may include an inorganic material, for example, silicon nitride. A fourth layer 41 may be disposed on the third layer 31. The fourth layer 41 may include an inorganic material, for example, silicon oxide or silicon nitride.

Additional metal bars ASC may be disposed on the third area AR3. In one exemplary embodiment, for example, the additional metal bars ASC may be disposed on the fourth layer 41. Each of the additional metal bars ASC may extend in the second direction DR2. In such an embodiment, the additional metal bars ASC may be arranged in the first direction DR1 to be spaced apart from each other. When viewed in a plan view, the additional metal bars ASC may not overlap the protrusions CBP.

The additional metal bars ASC may include a material different from that of the second sub-conductive portion SC2e. In one exemplary embodiment, for example, the second sub-conductive portion SC2e may include a single metal layer, and the second sub-conductive portion SC2e may include molybdenum. Each of the additional metal bars ASC may include a plurality of metal layers. In one exemplary embodiment, for example, each of the additional metal bars ASC may have a structure in which titanium, aluminum, and titanium are sequentially stacked.

In an exemplary embodiment of the disclosure, each of the additional metal bars ASC may have a thickness greater than a thickness of the second sub-conductive portion SC2e. In one exemplary embodiment, for example, the thickness of each of the additional metal bars ASC may be about 7,000 angstroms, and the thickness of the second sub-conductive portion SC2e may be about 2,800 angstroms. Accordingly, the additional metal bars ASC may serve to press the second sub-conductive portion SC2e. Therefore, the probability that the second sub-conductive portion SC2e is peeled off and the probability that the peeling phenomenon occurring in the second sub-conductive portion SC2e is expanded may be reduced. Thus, the reliability of the display device DD may be improved.

Although some exemplary embodiments of the disclosure have been described above, the invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display panel comprising:
   a base substrate in which a first area, a second area, and a third area are sequentially defined in a first direction;
   pixels disposed on the first area;
   signal lines disposed on the base substrate and electrically connected to the pixels;
   a power line disposed on the base substrate, wherein the power line supplies a power to the pixels;
   signal pads disposed on the second area, arranged in a second direction crossing the first direction, and electrically connected to the signal lines;
   power pads disposed on the second area, arranged in the second direction, and electrically connected to the power line; and
   a conductive portion comprising a first sub-conductive portion disposed on the second area of the base substrate and overlapping the power pads and a second sub-conductive portion disposed on the third area of the base substrate and spaced apart from the first sub-conductive portion,
   wherein the first sub-conductive portion and the second sub-conductive portion are electrically connected to a plurality of the same power pads arranged contiguous to each other in the second direction and the power line, and
   wherein an opening is defined in the second sub-conductive portion by a removed portion thereof.

2. The display panel of claim 1, wherein
   the first sub-conductive portion is disposed between the power pads and the base substrate; and
   the second sub-conductive portion is electrically connected to the first sub-conductive portion and the power pads.

3. The display panel of claim 2, wherein
   the second sub-conductive portion comprises conductive bars arranged in the second direction, and
   the conductive bars are spaced apart from each other in the second direction.

4. The display panel of claim 3, wherein each of the conductive bars has a width greater than a width of each of the power pads.

5. The display panel of claim 3, wherein a number of the conductive bars is less than a number of the power pads.

6. The display panel of claim 2, wherein the second sub-conductive portion comprises:
   a conductive body extending in the second direction; and
   conductive protrusions protruding from the conductive body to an edge of the base substrate,
   wherein a width in the second direction of each of the conductive protrusions is less than a width in the second direction of the conductive body.

7. The display panel of claim 6, wherein the conductive protrusions are spaced apart from each other in the second direction.

8. The display panel of claim 2, wherein the second sub-conductive portion comprises:
   first conductive bars arranged in the first direction; and
   second conductive bars arranged in the first direction,
   wherein the first conductive bars are disposed in a layer different from a layer in which the second conductive bars are disposed.

9. The display panel of claim 8, wherein the first conductive bars are alternately arranged with the second conductive bars in the first direction in a plan view.

10. The display panel of claim 8, wherein each of the first conductive bars and the second conductive bars extend in the second direction.

11. The display panel of claim 8, wherein the first conductive bars are electrically connected to the second conductive bars.

12. The display panel of claim 1, further comprising:
    an organic layer disposed to cover the conductive portion,
    wherein the organic layer extends in the second direction.

13. The display panel of claim 1, wherein the power line has a width greater than a width of each of the power pads.

14. The display panel of claim 1, wherein the base substrate comprises:
    an upper surface;
    a first slant surface extending from the upper surface;
    a side surface extending from the first slant surface;
    a second slant surface extending from the side surface; and
    a bottom surface extending from the second slant surface,
    wherein the first area, the second area and the third area are defined in the upper surface.

15. The display panel of claim 1, wherein
    the opening is provided in a groove form defined by the removed portion of the conductive portion in a thickness direction of the conductive portion.

16. The display panel of claim 15, further comprising:
    an additional metal bar disposed on the conductive portion,
    wherein the additional metal bar extends in the second direction.

17. A display device comprising:
    a display panel comprising a base substrate in which a first area, a second area, and a third area are sequentially defined in a first direction, pixels disposed on the first area, signal lines disposed on the first area, a power line disposed on the first area, signal pads electrically connected to the signal lines and disposed on the second area, power pads electrically connected to the power line and disposed on the second area, and a conductive portion disposed on the third area and electrically connected to the power pads; and a circuit board disposed on the display panel and electrically connected to the power pads and the signal pads, wherein an opening is defined in a portion of the conductive portion overlapping the third area, wherein the conductive portion comprises a plurality conductive bars spaced apart from each other, and wherein the power pads arranged contiguous to each other in a second direction crossing the first direction are directly connected to a same conductive bar of the plurality of conductive bars.

18. The display device of claim 17, wherein the display panel further comprises an organic layer disposed on the third area to cover the conductive portion.

19. The display device of claim 17, wherein the opening extends in the first direction, the conductive bars are spaced apart from each other with the opening interposed therebetween, each of the conductive bars has a width equal to or greater than a width of each of the power pads, and a number of the conductive bars is less than a number of the power pads.

20. The display device of claim 17, wherein the conductive portion comprises:

a conductive body extending in the second direction crossing the first direction; and conductive protrusions protruding from the conductive body to an edge of the base substrate, wherein a width in the second direction of each of the conductive protrusions is less than a width in the second direction of the conductive body.

21. The display device of claim 17, wherein the conductive portion comprises:

first conductive bars arranged in the first direction; and second conductive bars arranged in the first direction, wherein the first conductive bars are disposed in a layer different from a layer in which the second conductive bars are disposed.

22. The display device of claim 21, wherein each of the first conductive bars and the second conductive bars extend in a second direction crossing the first direction, the first conductive bars are alternately arranged with the second conductive bars in a plan view, and the first conductive bars are electrically connected to the second conductive bars.

\* \* \* \* \*